United States Patent
Yang et al.

(10) Patent No.: US 12,272,571 B2
(45) Date of Patent: *Apr. 8, 2025

(54) SYSTEMS AND METHODS FOR METASTABLE ACTIVATED RADICAL SELECTIVE STRIP AND ETCH USING DUAL PLENUM SHOWERHEAD

(71) Applicant: LAM RESEARCH CORPORATION, Fremont, CA (US)

(72) Inventors: Dengliang Yang, Union City, CA (US); Haoquan Fang, Sunnyvale, CA (US); David Cheung, Foster City, CA (US); Gnanamani Amburose, Fremont, CA (US); Eunsuk Ko, San Jose, CA (US); Wei Yi Luo, Fremont, CA (US); Dan Zhang, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/630,683

(22) Filed: Apr. 9, 2024

(65) Prior Publication Data
US 2024/0258130 A1      Aug. 1, 2024

Related U.S. Application Data

(60) Division of application No. 18/217,696, filed on Jul. 3, 2023, which is a continuation of application No.
(Continued)

(51) Int. Cl.
*H01L 21/67* (2006.01)
*H01J 37/32* (2006.01)
(Continued)

(52) U.S. Cl.
CPC ............ *H01L 21/67069* (2013.01); *H01J 37/32146* (2013.01); *H01J 37/32422* (2013.01); *H01J 37/32449* (2013.01); *H01J 37/32623* (2013.01); *H01J 37/32724* (2013.01); *H01J 37/32972* (2013.01); *H01J 37/3299* (2013.01);
(Continued)

(58) Field of Classification Search
CPC ......... H01L 21/67069; H01L 21/31138; H01L 21/3065; H01L 21/67098; H01J 37/32146; H01J 37/32422; H01J 37/32449; H01J 37/32623; H01J 37/32724; H01J 37/32972; H01J 37/3299; H01J 37/321; H01J 2237/334; B08B 5/023

See application file for complete search history.

(56) References Cited

U.S. PATENT DOCUMENTS 6,501,082 B1 * 12/2002 Goto ................. H01J 37/32623
333/99 PL
8,894,767 B2 * 11/2014 Chuc ................. C23C 16/45565
156/345.34
(Continued)

FOREIGN PATENT DOCUMENTS

JP           2004296603 A  * 10/2004  ............ H01J 37/321

*Primary Examiner* — Jeffrie R Lund

(57) ABSTRACT

Several designs of a gas distribution device for a substrate processing system are provided. The gas distribution device includes a dual plenum showerhead. Additionally, designs for a light blocking structure used with the showerheads are also provided.

19 Claims, 23 Drawing Sheets

Related U.S. Application Data

15/845,206, filed on Dec. 18, 2017, now Pat. No. 11,694,911.

(60) Provisional application No. 62/436,708, filed on Dec. 20, 2016, provisional application No. 62/513,615, filed on Jun. 1, 2017, provisional application No. 62/569,094, filed on Oct. 6, 2017.

(51) Int. Cl.
 *H01L 21/311* (2006.01)
 *B08B 5/02* (2006.01)

(52) U.S. Cl.
 CPC ........ *H01L 21/31138* (2013.01); *B08B 5/023* (2013.01); *H01J 37/321* (2013.01); *H01J 2237/334* (2013.01)

(56) References Cited

U.S. PATENT DOCUMENTS

| | | | | |
|---|---|---|---|---|
| 9,666,414 | B2* | 5/2017 | Lubomirsky | H01L 21/3065 |
| 9,741,584 | B1* | 8/2017 | Park | H01L 21/76224 |
| 11,694,911 | B2* | 7/2023 | Yang | H01J 37/32724 |
| | | | | 156/345.34 |
| 2007/0151956 | A1* | 7/2007 | Iino | H01L 21/31138 |
| | | | | 257/E21.256 |
| 2009/0130335 | A1* | 5/2009 | Okumura | H01J 37/321 |
| | | | | 427/569 |
| 2011/0011338 | A1* | 1/2011 | Chuc | C23C 16/45565 |
| | | | | 118/715 |
| 2012/0122302 | A1* | 5/2012 | Weidman | H01L 21/02274 |
| | | | | 118/723 R |
| 2013/0105303 | A1* | 5/2013 | Lubomirsky | H01L 21/6831 |
| | | | | 204/192.34 |
| 2014/0099794 | A1* | 4/2014 | Ingle | H01L 21/67069 |
| | | | | 156/345.35 |
| 2014/0235069 | A1* | 8/2014 | Breiling | H01J 37/32 |
| | | | | 239/548 |
| 2014/0311581 | A1* | 10/2014 | Belostotskiy | H01L 21/67253 |
| | | | | 137/565.13 |
| 2015/0083582 | A1* | 3/2015 | Dhindsa | H01L 21/67069 |
| | | | | 204/298.35 |
| 2015/0132970 | A1* | 5/2015 | Nishimura | H10N 50/01 |
| | | | | 156/345.35 |
| 2015/0187563 | A1* | 7/2015 | Underwood | C23C 16/54 |
| | | | | 438/492 |
| 2017/0207077 | A1* | 7/2017 | Nagorny | H01J 37/32009 |
| 2017/0229325 | A1* | 8/2017 | Lubomirsky | H01J 37/32587 |
| 2017/0236731 | A1* | 8/2017 | Caron | H01J 37/32816 |
| | | | | 438/714 |
| 2018/0088031 | A1* | 3/2018 | Yang | G01N 21/27 |
| 2018/0174870 | A1* | 6/2018 | Yang | H01J 37/32449 |
| 2022/0093365 | A1* | 3/2022 | Bao | H01J 37/321 |
| 2023/0369076 | A1* | 11/2023 | Yang | H01J 37/3299 |
| 2024/0258129 | A1* | 8/2024 | Yang | H01J 37/32724 |
| 2024/0258130 | A1* | 8/2024 | Yang | H01J 37/3299 |
| 2024/0258131 | A1* | 8/2024 | Yang | H01J 37/32623 |

\* cited by examiner

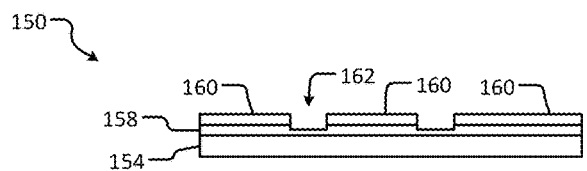
FIG. 2
FIG. 3
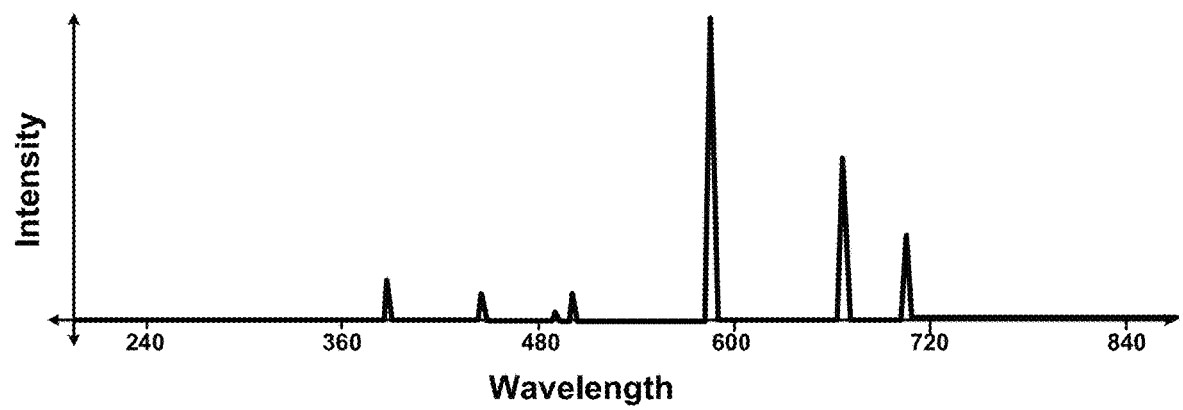
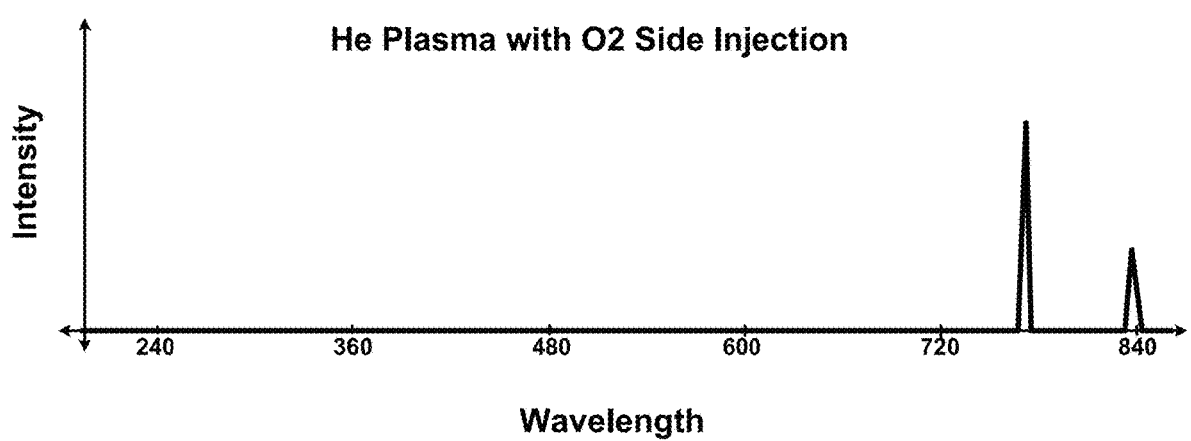
FIG. 4

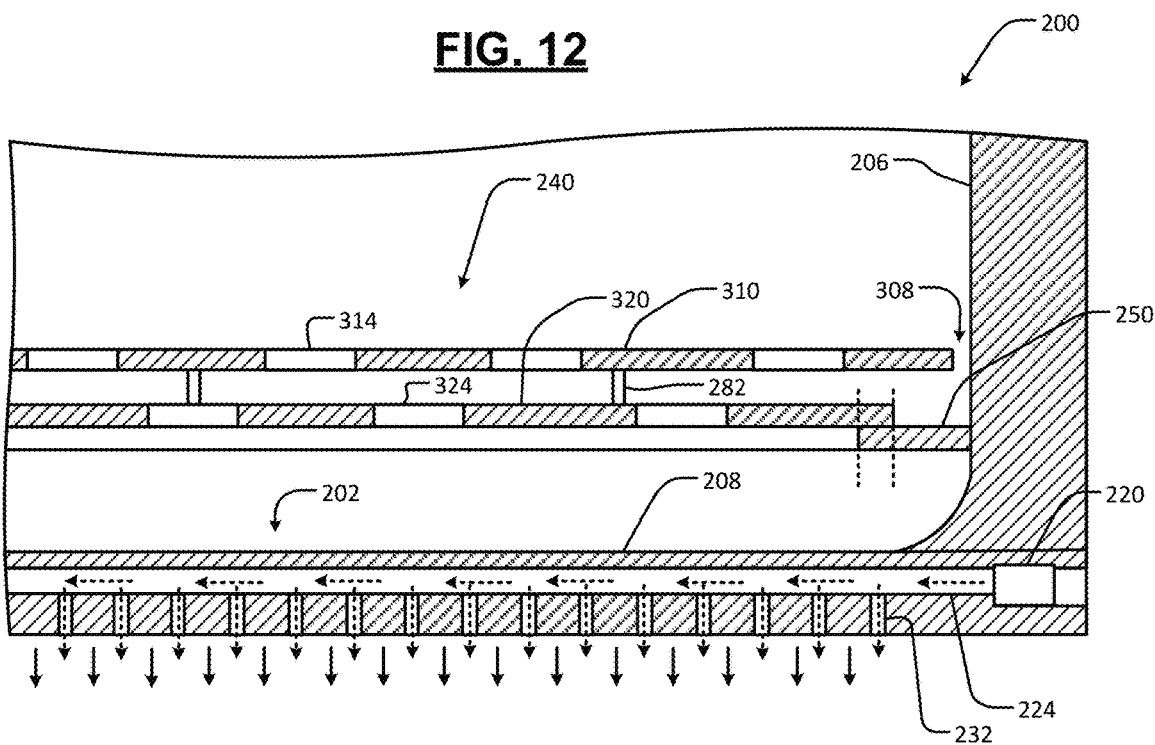
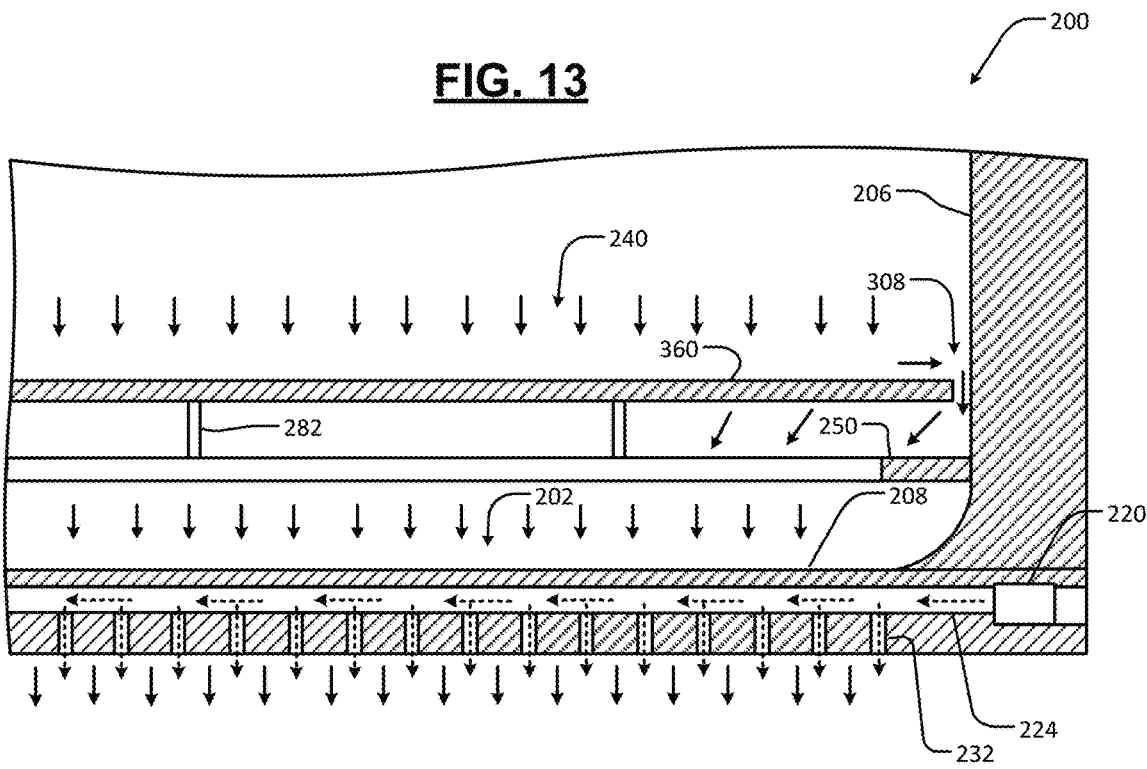

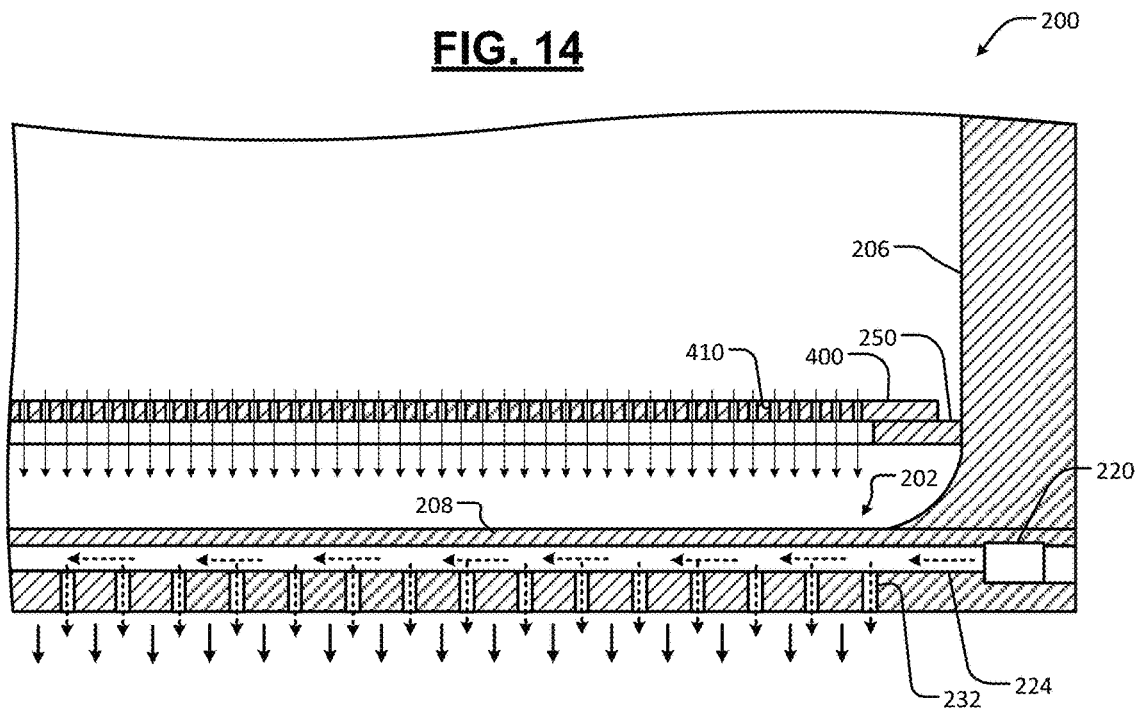
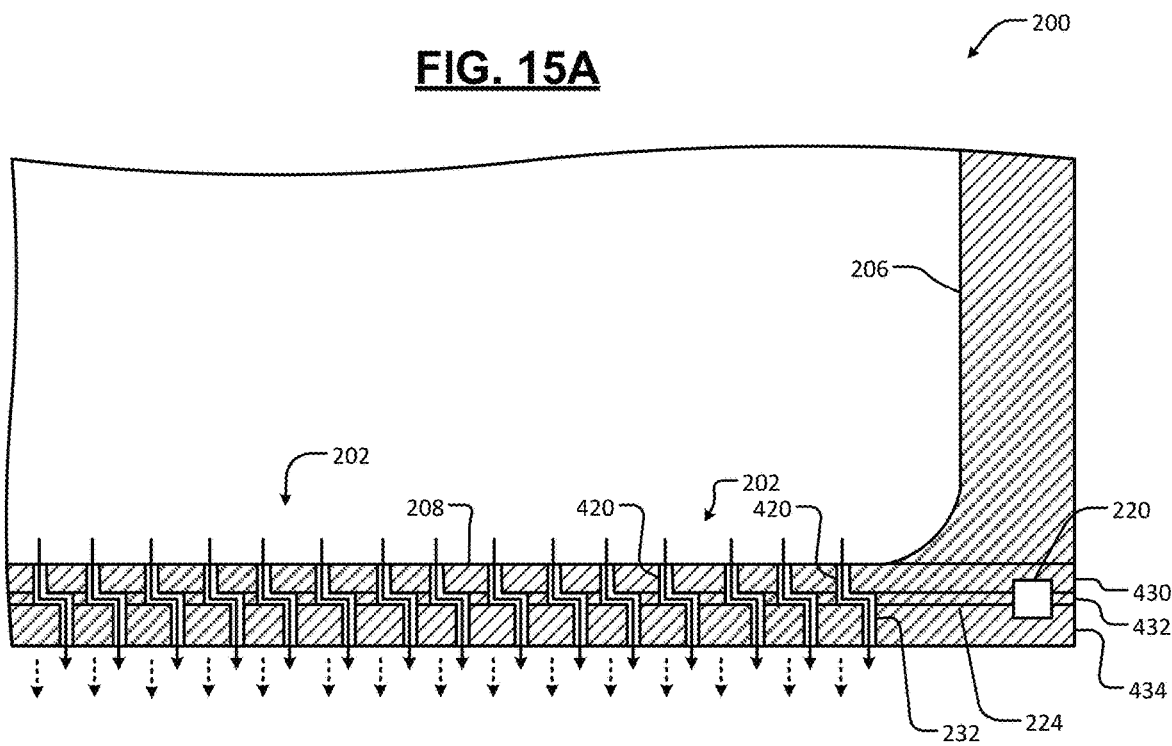

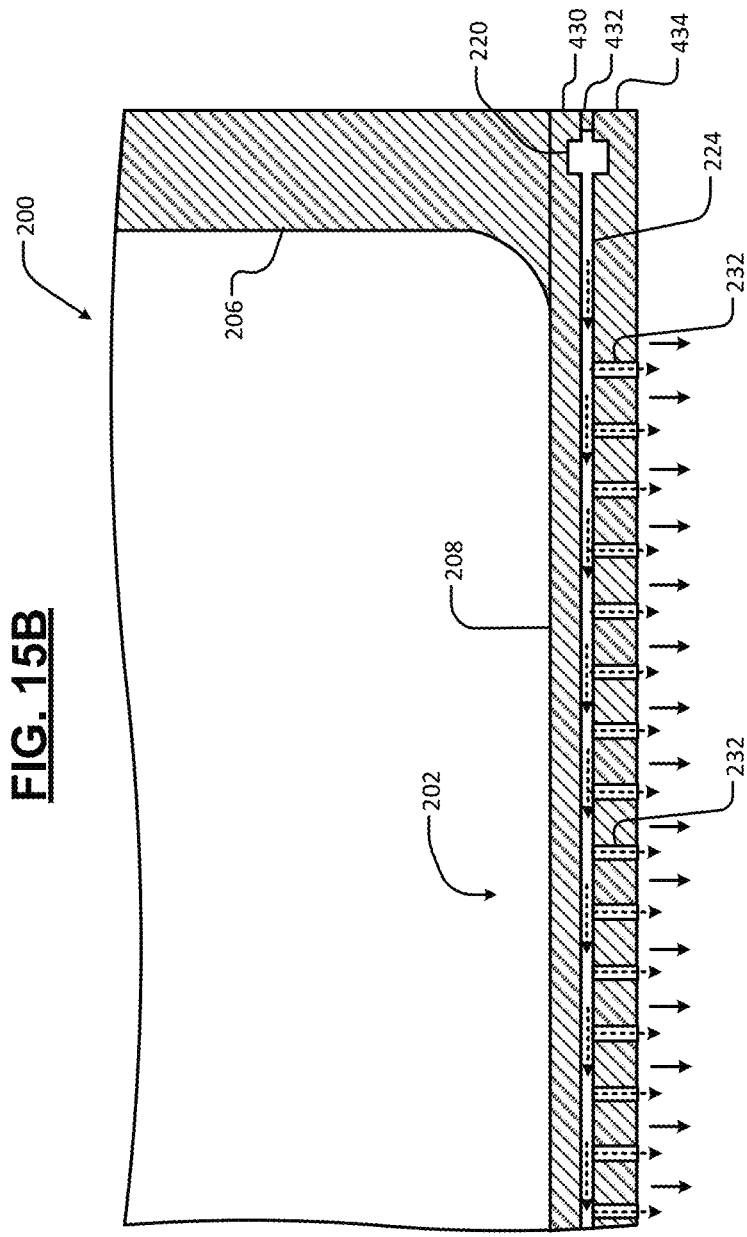

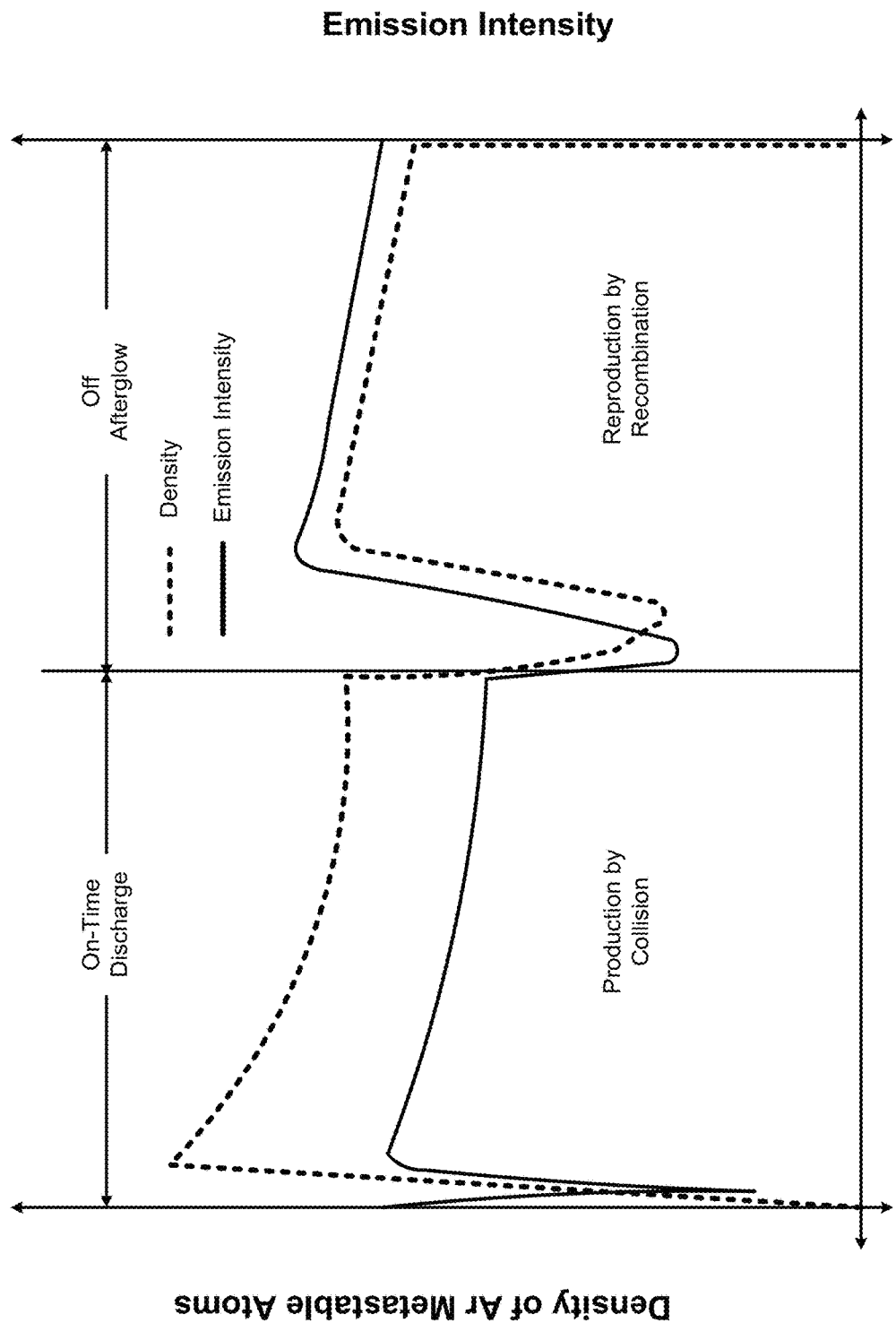

SYSTEMS AND METHODS FOR METASTABLE ACTIVATED RADICAL SELECTIVE STRIP AND ETCH USING DUAL PLENUM SHOWERHEAD

CROSS-REFERENCE TO RELATED APPLICATIONS

This application is a divisional of U.S. application Ser. No. 18/217,696, filed on Jul. 3, 2023, which is a continuation of U.S. Non-Provisional application Ser. No. 15/845,206, filed on Dec. 18, 2017 (now U.S. Pat. No. 11,694,911, issued Jul. 4, 2023), which claims the benefit of U.S. Provisional Application No. 62/436,708, filed on Dec. 20, 2016, U.S. Provisional Application No. 62/513,615, filed on Jun. 1, 2017, and U.S. Provisional Application No. 62/569,094 filed on Oct. 6, 2017. The entire disclosures of the applications referenced above are incorporated herein by reference.

FIELD

The present disclosure relates to substrate processing systems, and more particularly to substrate processing systems for stripping photoresist or selectively removing film from a substrate with high selectivity.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to strip photoresist on a substrate such as a semiconductor wafer. The substrate processing systems typically include a processing chamber, a gas distribution device and a substrate support. During processing, the substrate is arranged on the substrate support. Different gas mixtures may be introduced into the processing chamber and radio frequency (RF) plasma may be used to activate chemical reactions.

Plasma-based strip technologies typically use radical species to remove a photoresist layer. Substrate processing systems may use capacitively coupled plasma (CCP) or inductively coupled plasma (ICP) to generate radicals directly above the substrate. CCP and ICP processes are typically used for in-situ photoresist strip after performing a plasma etch process. Advantages of these processes include stripping without a vacuum break and a relatively high removal rate. However, ions or vacuum ultraviolet (VUV) photons generated by the direct plasma may damage underlying layers and cause measurable substrate loss in areas exposed to the direct plasma.

Substrate processing systems using downstream plasma sources such as ICP, electron cyclotron resonance (ECR) or microwave sources may also be used. The amount of exposure of the substrate to ion and photon flux can be minimized using a showerhead. While this approach has lower substrate loss, the removal rate is typically lower due to loss through surface recombination on dome/tube surfaces, chamber walls and/or showerhead surfaces. Furthermore, there is still measurable substrate loss due to the generated active oxidation species from background species such as molecular oxygen ($O_2$), water ($H_2O$), atomic O, OH and sputtering from dome/tube materials that are directly exposed during the plasma generation.

SUMMARY

A substrate processing system for selectively etching a substrate includes a first chamber and a second chamber. A first gas delivery system supplies an inert gas species to the first chamber. A plasma generating system generates plasma including ions and metastable species in the first chamber. A gas distribution device is arranged between the first chamber and the second chamber to remove the ions from the plasma, to block ultraviolet (UV) light generated by the plasma and to deliver the metastable species to the second chamber. A substrate support is arranged below the gas distribution device to support the substrate. A second gas delivery system delivers a reactive gas species to one of the gas distribution device or a volume located below the gas distribution device. The metastable species transfer energy to the reactive gas species to selectively etch one exposed material of the substrate more than at least one other exposed material of the substrate.

In other features, the one exposed material of the substrate includes photoresist. The substrate processing system etches the photoresist at a ratio greater than 50:1 relative to at least one other exposed material of the substrate. The at least one other exposed material is selected from a group consisting of silicon, silicon germanium, and silicon dioxide. The inert gas species is selected from a group consisting of helium, argon, neon, krypton and xenon.

In other features, the reactive gas species is selected from a group consisting of molecular oxygen, molecular nitrogen, molecular hydrogen, nitrogen trifluoride and carbon tetrafluoride. The plasma generating system includes an inductive coil arranged around an outer surface of the first chamber and wherein the plasma generating system selectively supplies 500 W to 5 kW to the coil to generate the plasma.

In other features, the substrate support controls a temperature of the substrate to a predetermined temperature range from 75° C. to 225° C. during etching. The inert gas species and the reactive gas species are supplied at a flow rate of 50 sccm to 10 slm. A light blocking structure is arranged above the gas distribution device.

In other features, the light blocking structure comprises a first light blocking plate including a first plurality of through holes. A second light blocking plate is located between and spaced from the first light blocking plate and the gas distribution device and includes a second plurality of through holes. The first plurality of through holes is not aligned with the second plurality of through holes. The metastable species flow through the first plurality of through holes and the second plurality of through holes to the gas distribution device.

In other features, the first plurality of through holes and the second plurality of through holes have a diameter in a range from 0.1" to 2". The first light blocking plate and the second light blocking plate have a thickness in a range from 0.1" to 0.5". Each of the first plurality of through holes and the second plurality of through holes comprises 10 to 3000 holes.

In other features, an annular plate is located above the first light blocking plate, includes a radially outer edge that extends to a sidewall of the first chamber and includes a radially inner edge having a diameter that is less than an outer diameter of the first light blocking plate.

In other features, the light blocking structure comprises a first light blocking plate without through holes and including a radially outer edge that is spaced from a sidewall of the first chamber. A second light blocking plate is located between and spaced from the first light blocking plate and the gas distribution device and includes a plurality of through holes. The metastable species flow around the first light blocking plate and through the plurality of through holes of the second light blocking plate to the gas distribution device.

In other features, the light blocking structure comprises a light blocking plate without through holes. The light blocking plate includes a radially outer edge that is spaced from a sidewall of the first chamber. An annular plate is spaced from the light blocking plate and the gas distribution device, extends to the sidewall of the first chamber and has an inner diameter that is less than an outer diameter of the light blocking plate. The metastable species flow around the light blocking plate and through the inner diameter of the annular plate to the gas distribution device.

In other features, the gas distribution device includes a first surface facing the first chamber and a second surface facing the second chamber. A gas inlet receives the reactive gas species from the second gas delivery system. Channels located in the gas distribution device deliver the reactive gas species from the gas inlet to a plurality of locations above the substrate. A first plurality of through holes extends from the channels through the second surface to the second chamber. A second plurality of through holes extends from the first surface to the second surface to deliver the metastable species to the second chamber.

In other features, the channels include an annular channel arranged adjacent to a radially outer edge of the gas distribution device and a plurality of connecting channels extending across the gas distribution device between the annular channel.

In other features, the gas distribution device includes a first surface facing the first chamber and a second surface facing the second chamber. A plurality of through holes define an indirect path through the gas distribution device from the first surface to the second surface.

In other features, the gas distribution device includes a first surface facing the first chamber and a second surface facing the second chamber. A first gas inlet receives a first reactive gas species from the second gas delivery system. A second gas inlet receives a second reactive gas species from the second gas delivery system. First channels are located in the gas distribution device to deliver the first reactive gas species from the first gas inlet to a plurality of locations in a first zone above the substrate. Second channels are located in the gas distribution device to deliver the second reactive gas species from the second gas inlet to a plurality of locations in a second zone above the substrate. A first plurality of through holes extends from the first channels through the second surface to deliver the first reactive gas species to the second chamber. A second plurality of through holes extends from the second channels through the second surface to deliver the second reactive gas species to the second chamber. A third plurality of through holes extends from the first surface to the second surface to deliver the metastable species to the second chamber.

In other features, a portion of the first channels extends radially inwardly to the first zone. A portion of the second channels extends radially inwardly to the second zone. The first plurality of through holes, the second plurality of through holes, and the third plurality of through holes are arranged in concentric circles. A light blocking structure is arranged above the gas distribution device.

In other features, the light blocking structure comprises a plate including arcuate holes that are misaligned relative to the first plurality of through holes, the second plurality of through holes, and the third plurality of through holes.

In other features, the plasma generating system further comprises a pulse modulator configured to vary a pulsing parameter of an RF signal that generates plasma during etching. The pulse modulator varies at least one of a duty cycle and an amplitude of the RF signal supplied during etching. The pulse modulator varies the pulsing parameter between a first state having a first RF power and second state having a second RF power that is less than the first RF power.

In other features, the pulse modulator switches between the first state and the second state at predetermined intervals during etching. The pulse modulator receives an optical feedback signal and switches between the first state and the second state during etching based on the optical feedback signal. A first intensity of the metastable species during the first state is less than a second intensity of the metastable species during the second state. The RF signal has an envelope selected from a group consisting of a square wave, a rectangular wave, a sinusoidal wave, and a saw tooth wave.

In other features, the RF signal has a rectangular wave envelope and switches at a duty cycle that is less than 100% between a first amplitude and a second amplitude. The first amplitude is greater than the second amplitude and wherein the second amplitude is greater than or equal to zero.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2 is a side cross-sectional view of an example of a substrate including a silicon layer and a photoresist layer to be stripped;

FIG. 3 is a graph illustrating optical emission spectroscopy (OES) characterization of the plasma with He only;

FIG. 4 is a graph illustrating OES characterization of He plasma with $O_2$ injection from the side between the showerhead and the substrate support;

FIGS. 11-13 are side cross-sectional views of other examples of light blocking structures and the dual gas plenum according to the present disclosure;

FIG. 14 is a side cross-sectional view of a gas distribution device including a showerhead and a dual gas plenum;

FIGS. 15A and 15B is a side cross-sectional view of another example of a dual gas plenum according to the present disclosure;

FIG. 23B is a graph illustrating a fast electron effect created by pulsing the plasma according to the present disclosure;

In the drawings, reference numbers may be reused to identify similar and/or identical elements.

DETAILED DESCRIPTION

Figure 1:
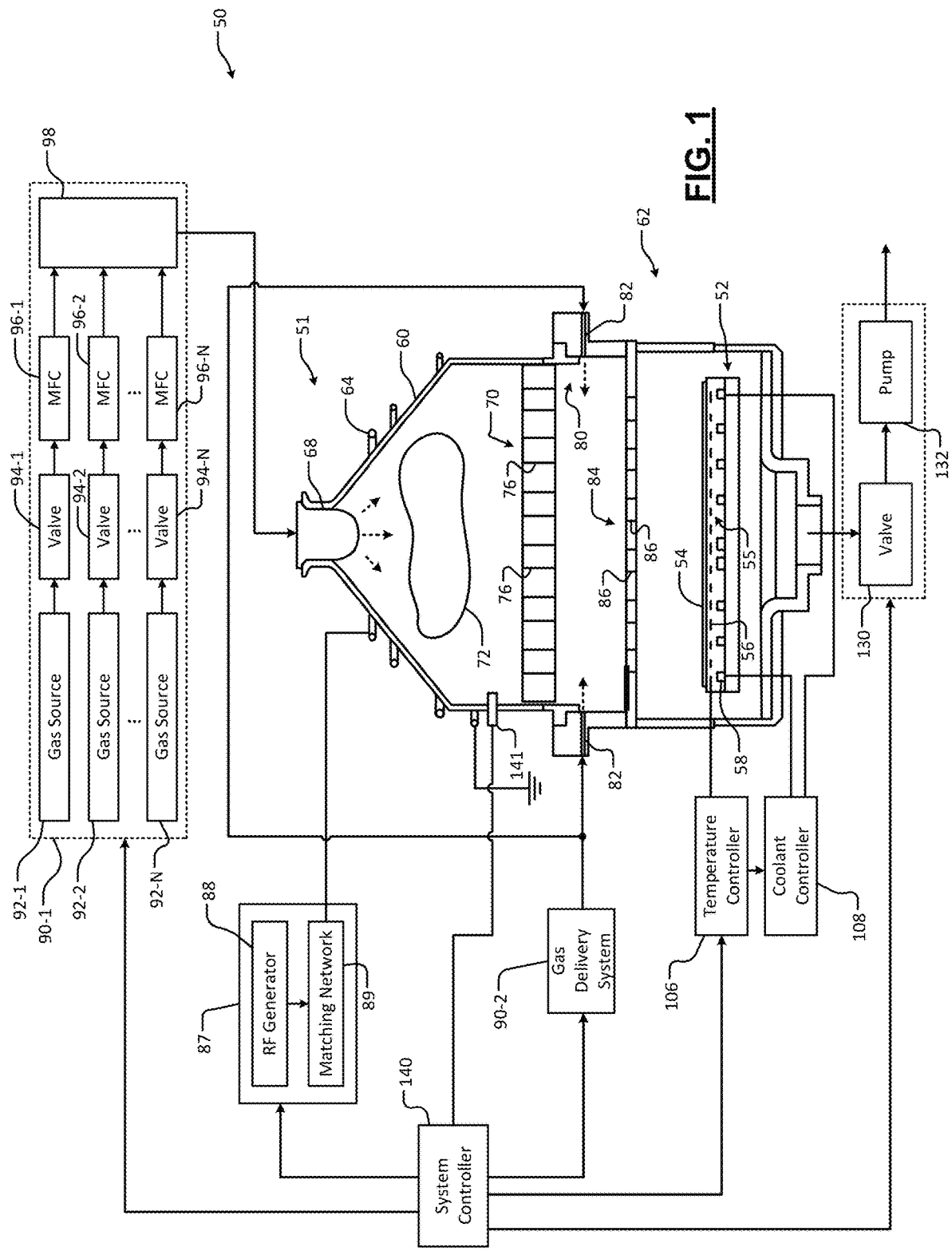
FIG. 1 is a functional block diagram of an example of a substrate processing system according to the present disclosure.
Figure 22:
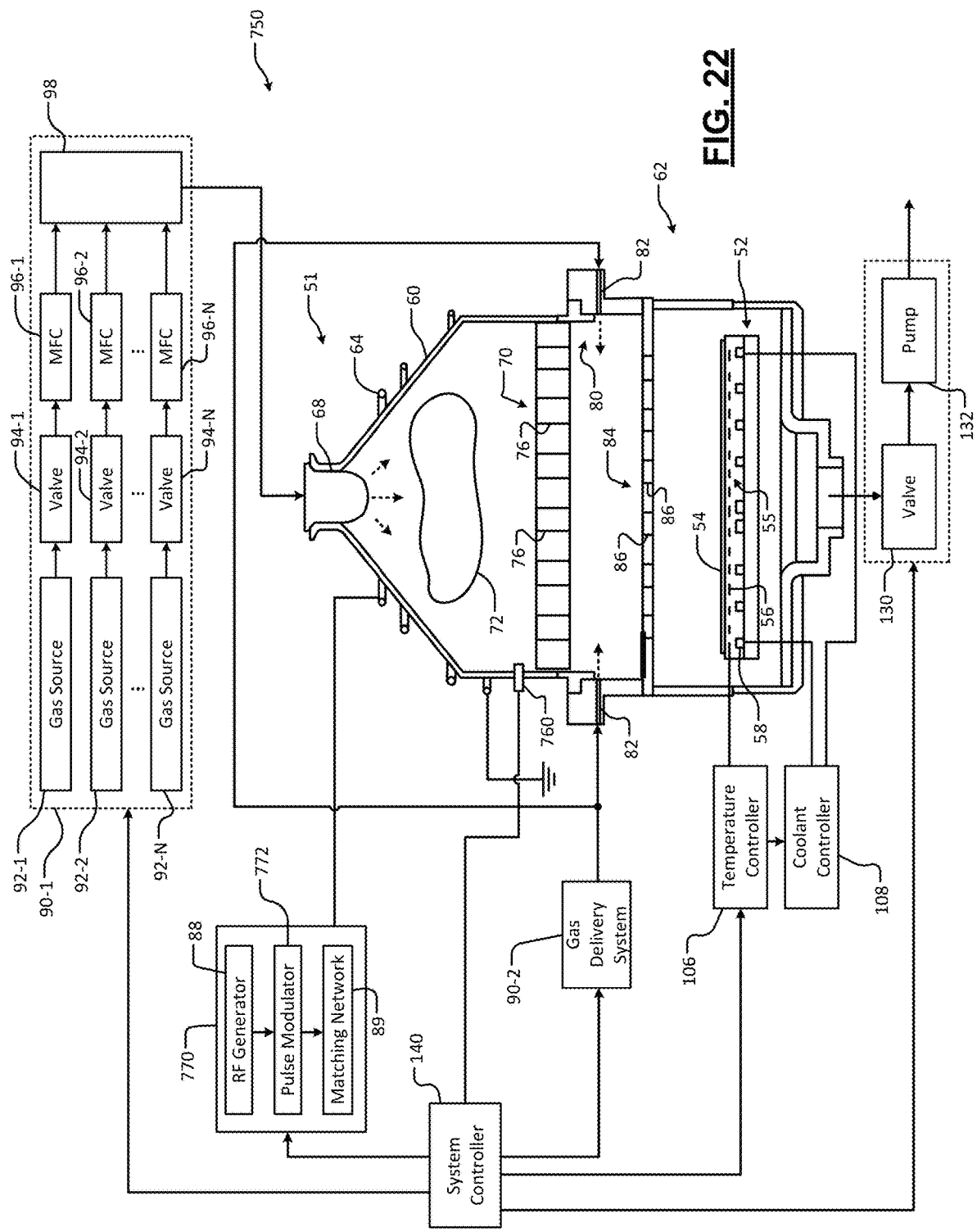
FIG. 22 is a functional block diagram of another example of a substrate processing system including plasma pulsing that is selected or controlled based on optical feedback according to the present disclosure.

Systems and methods according to the present disclosure utilize a plasma source to supply plasma including metastable species and ions in an upper chamber (e.g., element 60 shown in FIGS. 1 and 22). The metastable species diffuse through a first showerhead located between the upper chamber and a substrate support arranged in a lower chamber (e.g., element 62 shown in FIGS. 1 and 22).

The first showerhead blocks trace amounts of He ions and vacuum ultraviolet (VUV) or UV emission. In some examples, a second showerhead may be arranged between the first showerhead and the substrate support. The second showerhead may be used to re-direct active strip species or etch species uniformly above the substrate.

Active etching species are injected from a side of the processing chamber between the first showerhead (or the second showerhead) and the substrate support. The metastable species transfer energy to the active etching species to generate radicals for film removal.

For example, an ICP source and an inert plasma gas such as Helium (He) may be used to generate He active species including low kinetic energy (<1 eV) metastable species (He*) that have high excitation energy in the range of 19-21 eV. The metastable species have a lifetime in a range of 10 seconds or greater. The metastable species diffuse through the first showerhead and are used to activate the etching species. The reactive gas or gas mixture is injected from a different location than the active plasma source to reduce erosion of chamber surface materials.

Referring now to FIG. 1, an example substrate processing system 50 for selectively stripping film such as photoresist or other film is shown. As used herein, selective stripping refers to stripping exposed film made of a first material at a higher rate than stripping of one or more other exposed films made of other materials. In some examples, the ratio of stripping of the target film relative to the other (non-target) films is greater than or equal to 50:1, 200:1, 500:1, 2000:1, etc. While the foregoing example will be described in the context of a substrate processing system using inductively coupled plasma (ICP), the present disclosure may be applied to other substrate processing systems generating plasma using other plasma sources.

The substrate processing system 50 includes a plasma source 51 and a substrate support 52 such as an electrostatic chuck, pedestal or other type of substrate support. In some examples, the plasma source 51 includes an ICP source. As can be appreciated, the plasma source 51 may include other suitable plasma sources such as CCP, ECR or microwave plasma sources.

A substrate 54 is arranged on the substrate support 52 during the selective stripping. In some examples, the substrate support 52 is temperature controlled (heating and/or cooling) using one or more temperature control elements (TCEs) 55, as resistive heaters 56, coolant channels 58, or other types of thermal control devices. The substrate support 52 may include a single temperature control zone or a plurality of temperature control zones that are individually controlled.

The substrate processing system 50 includes an upper chamber 60. In some examples, the upper chamber 60 has a dome shape, although other shapes can be used. When ICP plasma is used, a coil 64 is arranged around an outer surface of the upper chamber 60. A gas injector 68 injects plasma gas into the upper chamber 60. In some examples, the gas injector 68 injects the plasma gas in one or more directions (such as center and side gas injection directions as shown in FIG. 1).

The substrate processing system 50 further includes a gas distribution device 70 such as a platen including a plurality of spaced through holes 76. The gas distribution device 70 is used to filter ions generated by the plasma and to block VUV or UV radiation. The gas distribution device 70 is arranged between the substrate support 52 and the upper chamber 60. Secondary gas injectors 82 inject secondary gas in a location between the gas distribution device 70 and the substrate support 52. In some examples, the secondary gas injectors 82 are arranged at uniform intervals around the periphery of the processing chamber. In some examples, another gas distribution device 84 (such as a platen including a plurality of spaced through holes 86) may be arranged between the gas distribution device 70 and the substrate support 52. The gas distribution device 84 may be used to redirect active strip species or etch species above the substrate.

If ICP plasma is used, an RF generating system 87 generates and outputs an RF power to the coil 64. For example only, the RF generating system 87 may include an RF generator 88 that generates RF power that is fed by a matching network 89 to the coil 64.

A gas delivery system 90-1 includes one or more gas sources 92-1, 92-2, . . . , and 92-N (collectively gas sources 92), where N is an integer greater than zero. The gas sources 92 are connected by valves 94-1, 94-2, . . . , and 94-N (collectively valves 94) and mass flow controllers 96-1, 96-2, . . . , and 96-N (collectively mass flow controllers 96) to a manifold 98. Another gas delivery system 90-2 may be used to deliver the secondary gas to the secondary gas injectors 82. As can be appreciated, the gas delivery systems 90 may be simplified in the case that the substrate processing system uses a single plasma gas and a single secondary gas.

A temperature controller 106 may be connected to the TCEs 55 such as the resistive heaters 56. The temperature controller 63 may communicate with one or more temperature sensors (not shown) that sense a temperature of the substrate support or the substrate and to a coolant controller 108 to control coolant flow through the coolant channels 58. For example, the coolant controller 108 may include a coolant pump, a reservoir and/or one or more temperature sensors (not shown). A valve 130 and pump 132 may be used to control pressure in the processing chamber and to evacuate reactants therefrom. A system controller 140 may be used to control components of the substrate processing system 10 as shown in FIG. 1.

Systems and methods according to the present disclosure generate plasma utilizing inert gas to generate a high density of metastable species. The metastable species carry high enough chemical energy to excite other active radical species introduced downstream. The systems and methods described herein spatially decouple plasma generation and etching species production. Advantages include reduced charged ions and VUV and/or UV light emission as compared to direct plasma such as ICP and capacitively coupled plasma (CCP). The systems and methods described herein have higher radical density above the substrate as compared to downstream plasma with much lower recombination loss. The proposed systems and methods have separate plasma generation and active species generation, which reduces erosion of chamber materials exposed to the high density direct plasma. The systems and methods described herein have higher strip rates, higher etch selectivity and lower substrate oxidation or loss.

In some examples, the process is operated using an ICP chamber with ICP power in a range from 500 W to 5 kW. In some examples, the RF power applied to the inductive coil is at 13.56 MHz, although other frequencies can be used. In some examples, the process is performed at a chamber pressure range of 10 mTorr to 10 Torr. In some examples, the plasma gas or gas mixture is supplied at a flow rate in a range from 50 standard cubic centimeters per minute (sccm) to 10 standard liters per minute (slm). In some examples, reactive gas is supplied at a flow rate in a range from 50 sccm to 10 slm.

In some examples, the plasma gas or plasma gas mixture includes an inert gas such as He, argon (Ar), neon (Ne), krypton (Kr), xenon (Xe), and mixtures thereof. In some examples, the active etching gas includes at least one of molecular oxygen ($O_2$), molecular nitrogen ($N_2$), molecular hydrogen ($H_2$), carbon tetrafluoride ($CF_4$), nitrogen trifluoride ($NF_3$), and/or their mixtures.

In use, the plasma source creates plasma including metastable species and ions in the upper chamber. The metastable species diffuse through the showerhead(s). Active etching species are injected from the side of the chamber under or between the showerhead(s). The metastable species transfer energy to the active etching species to generate radicals for photoresist removal.

Referring now to FIG. 2, a substrate 150 includes one or more underlying layers 154. A silicon dioxide layer 158 is arranged on the underlying layers 154. A photoresist layer 160 is arranged on some portions of the silicon dioxide layer 158. After processing such as etching is performed (at 162) to etch the silicon dioxide layer 158, the photoresist layer 160 needs to be removed. The process for stripping the photoresist layer 160 is preferably performed without loss or damage to the silicon dioxide layer 158.

The plasma source generates plasma by igniting a plasma gas. Metastable atoms that are produced (e.g. He*) exit the plasma source through the showerhead(s). The showerhead(s) filter most if not all energetic damage-producing ions and vacuum ultraviolet light (VUV) and/or UV light. The metastable atoms are then mixed with a secondary gas (such as $O_2$) injected under or between the showerhead(s) and the substrate support. For example, the secondary gas can be injected from the side injector ports. The injected gas species can be excited by He* metastable through penning ionization: $He^*(2^3S)+O_2 \rightarrow O_2^+ + He + e-$ and further dissociated to atomic O* species. It is beneficial for certain process to generate molecular radical species to increase strip or etch selectivity. While mixing O2 within He plasma, most of the species are atomic oxygen. The excited molecular O2 impinge on the photoresist-coated substrate can remove the film, but forms self-limiting layer on Silicon, silicon germanium or other substrates that need to be protected.

Referring now to FIGS. 3 and 4, optical emission spectroscopy (OES) characterization of He only plasma and He plasma with secondary $O_2$ gas injection is shown. In FIG. 3, OES characterization of the plasma with He only is shown. In FIG. 4, OES characterization of He plasma with $O_2$ injection from the side under the showerhead is shown. The net effect is that photoresist is stripped by the O* atoms with very low damage to Si (e.g. very small loss of $SiO_2$) and also very high strip rate.

The injection of $O_2$ gas from the side quenched most of the light emission from He active species as shown in FIG. 4. The optical emission spectra shows dominant $O_2$ emissions at 777 nm and 844 nm, which correspond to characteristic optical emission lines of activated oxygen species.

In the following comparison, an $O_2/N_2$ downstream plasma process has been optimized to remove a surface modification layer with minimum amorphous silicon (a-Si) substrate loss. 5× higher organic layer removal amount can be demonstrated with comparable a-Si substrate loss. The following example used increased pressure for $O_2/N_2$ process to minimize the energetic $O_2$ or $O^-$ species, while the process described (He/O$_2$) can be run at 4× lower pressure to increase the efficiency of activated radical species.

| Process | Pressure (torr) | Si loss (A) (minus metrology) | Baked PR Removal (A) 20 s | Baked PR Removal (A) 200 s |
| --- | --- | --- | --- | --- |
| O2/N2 | 4 | 3.3 | 12 | 368 |
| He Only | 1.1 | 6.5 | 6 | 129 |
| He Activated O2 | 1.1 | 3.8 | 133 | 1745 |
| He Activated O2 | 2.0 | 1.2-1.4 | 24 | 2500 |

Figure 5:
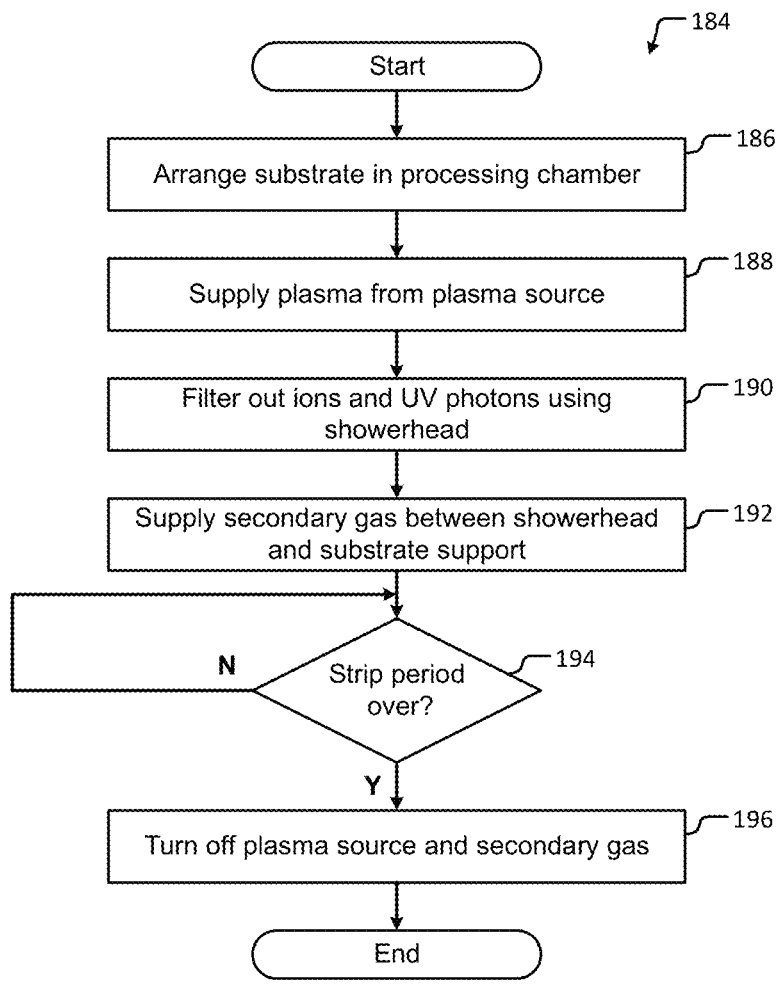
FIG. 5 is a flowchart illustrating an example of a method for selectively stripping photoresist according to the present disclosure.

Referring now to FIG. 5, a method 184 for stripping photoresist according to the present disclosure is shown. At 186, a substrate is arranged in a processing chamber. At 188, plasma is supplied to the processing chamber by a plasma source. At 190, ions and VUV or UV light is at least partially filtered by one or more showerheads arranged between the plasma source and the substrate support. At 192, the secondary gas is supplied between at least one of the showerheads and the substrate support. When the strip period is over as determined at 194, the plasma source and secondary gas are turned off at 196.

While the foregoing disclosure relates to photoresist strip, the systems and methods described herein can be used for other purposes. In other examples, a gas such as molecular nitrogen N$_2$ can be excited by the metastable species and used downstream to nitride a film or to treat a surface. For example, a titanium film can be exposed to nitride (e.g. Ti and N$_2$→TiN). In another example, a tungsten film can be treated (e.g. treatment of W with N* would produce WN that would is more difficult to remove with fluorine than is W).

Figure 6:
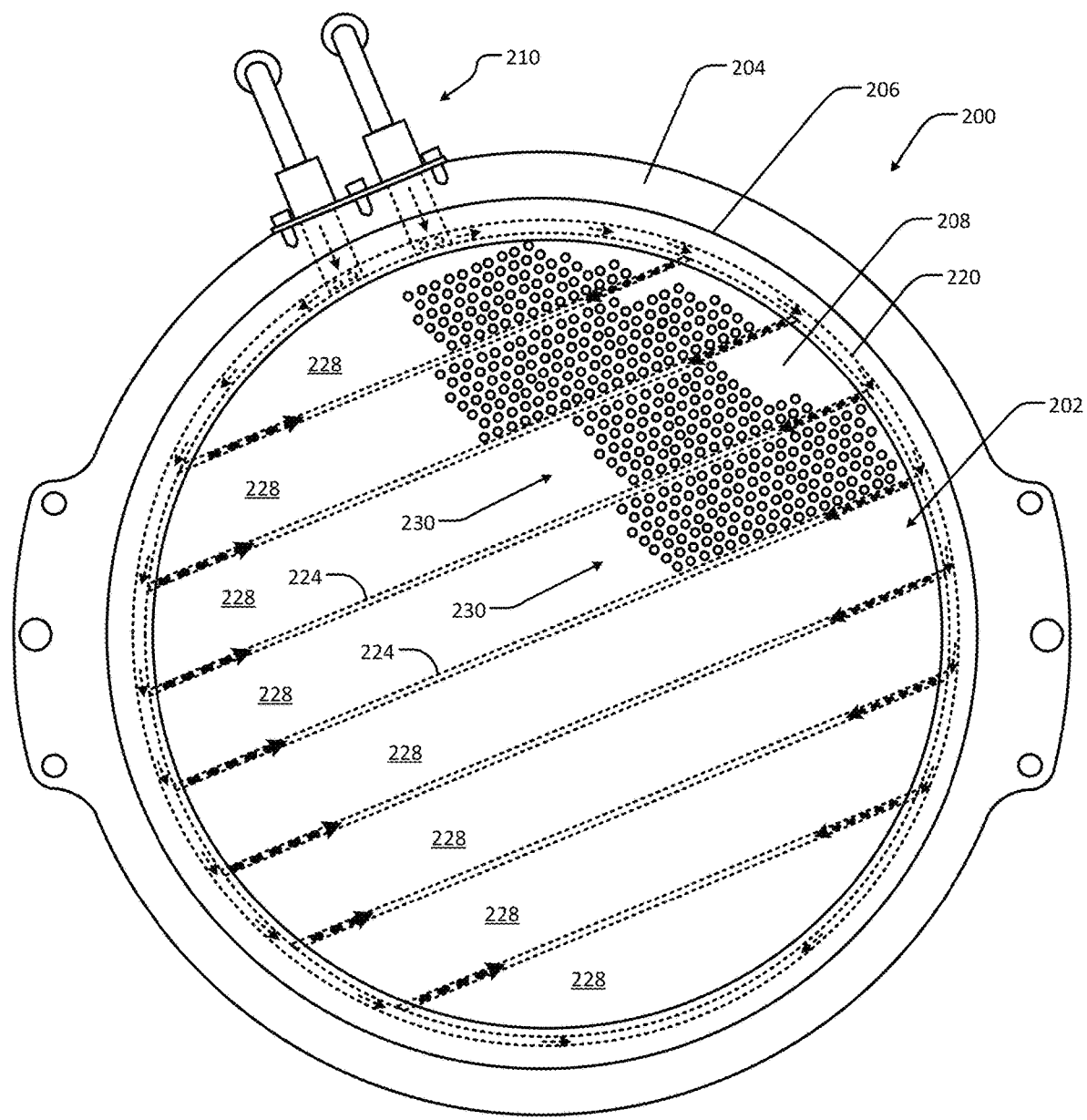
FIG. 6 is a plan view illustrating an example of a gas distribution device including a dual gas plenum according to the present disclosure.

Referring now to FIG. 6, a gas distribution device 200 includes a dual gas plenum 202 for delivering reactant gas species and excited gas species including metastable species according to the present disclosure is shown. The dual gas plenum 202 delivers a mixture of the reactant gas species and excited gas species to the lower chamber without mixing in the upper chamber.

In some examples, a flow ratio of excited gas species to reactant gas species is in a range from 1.3 to 10:1, although other ratios may be used. In some examples, the process period is in a range from 30 s to 270 s, although other periods may be used. In other examples, the process period is in a range from 60 s to 240 s, although other periods may be used. In some examples, the process temperature is in a range from 75° C. to 225° C., although other process temperatures may be used. In other examples, the process temperature is in a range from 100° C. to 200° C., although other process temperatures may be used. In some examples, loss of amorphous silicon or silicon germanium (SiGe) is reduced by over 50% as compared to prior strip processes.

The gas distribution device 200 includes an upper flange 204, sidewalls 206 and a bottom surface 208 (forming an upper surface of the dual gas plenum 202). The dual gas plenum 202 includes a gas inlet 210 for receiving a reactant gas species such as molecular oxygen (O$_2$), molecular nitrogen (N$_2$), molecular hydrogen (H$_2$), nitrogen trifluoride (NF$_3$), methane (CH$_4$), and combinations thereof. The reactant gas species is shown by arrows with dotted lines in FIGS. 6-16.

The dual gas plenum 202 defines an annular channel 220 and connecting channels 224. The connecting channels 224 extend between opposite sides of the annular channel 220 across inner portions of the bottom surface 208. The annular channel 220 may be formed at a location between the sidewalls 206 and the bottom surface 208. The annular channel 220 and the connecting channels 224 are in fluid communication with the gas inlet 210. The reactant gas mixture flows through the annular channel 220 and into the connecting channels 224. Downwardly directed though holes shown in FIG. 7 direct the reactant gas mixture from the connecting channels 224 into the lower chamber towards the substrate as will be described further below.

Areas 228 located between the connecting channels 224 include a plurality of through holes 230 that pass through the bottom surface 208. As can be appreciated, only some of the plurality of through holes 230 are shown for purposes of illustration and clarity. In some examples, the plurality of through holes 230 have a circular cross section and uniform spacing, although other cross sections and/or non-uniform spacing can be used. In some examples, the plurality of through holes 232 have a diameter in a range from 3 mm to 10 mm, although other diameters may be used.

Plasma is generated in the upper chamber using a plasma gas mixture including one or more gases selected from a group consisting of helium (He), neon (Ne), argon (Ar), krypton (Kr), xenon (Xe), molecular nitrogen (N$_2$), and combinations thereof. Excited gas species generated by the plasma are shown by arrows with solid lines in FIGS. 6-16.

Figure 7:
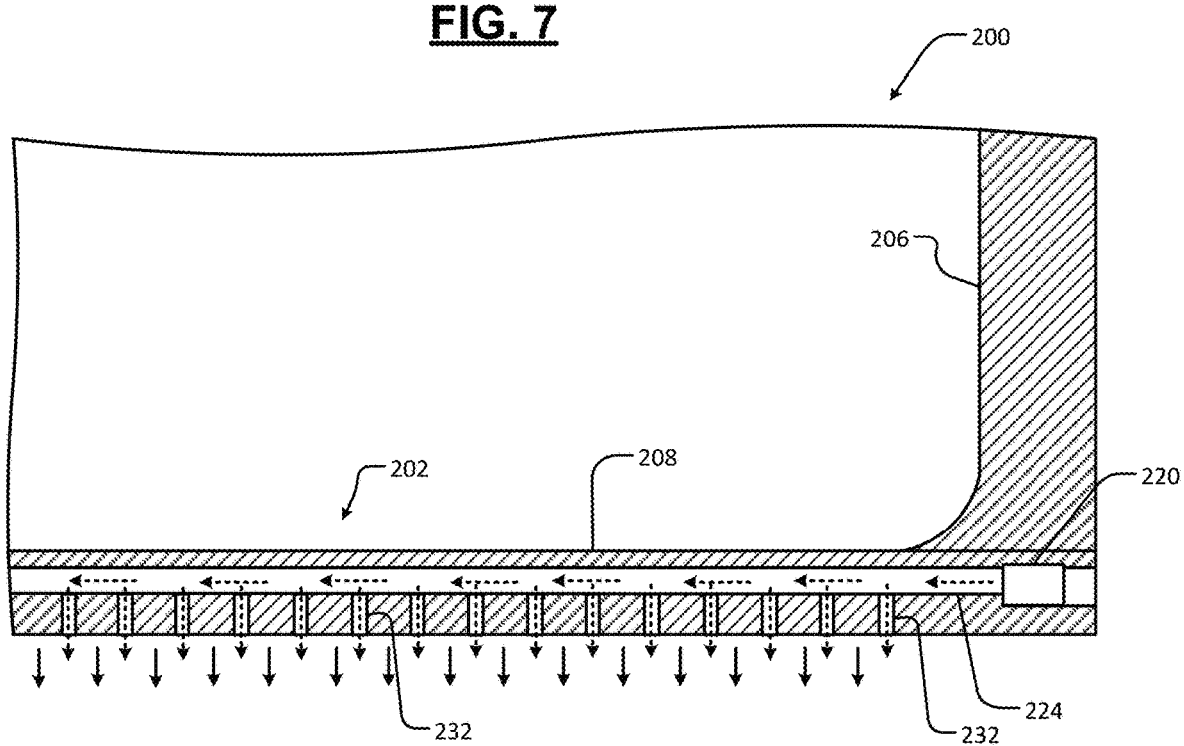
FIG. 7 is a first cross-sectional view of the dual gas plenum of FIG. 6 according to the present disclosure.
Figure 8:
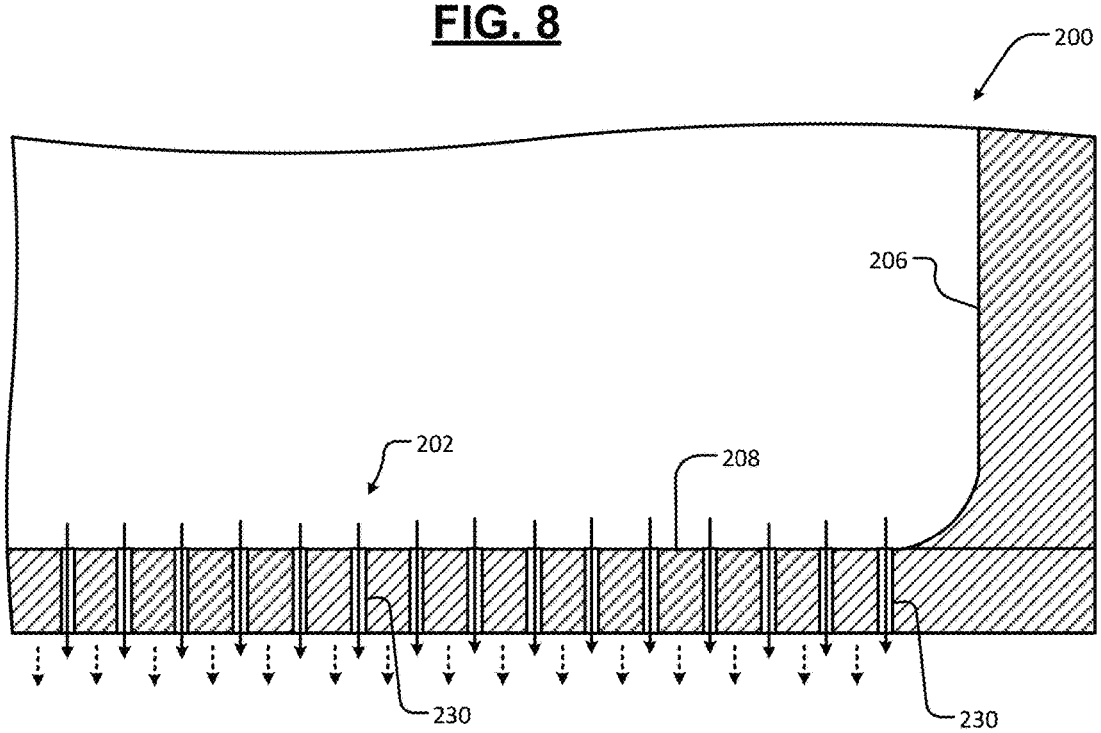
FIG. 8 is a second cross-sectional view of the dual gas plenum of FIG. 6 according to the present disclosure.

Referring now to FIGS. 7-8, cross-sectional views of the bottom surface 208 of the dual gas plenum 202 are shown. In FIG. 7, a first cross-sectional view taken along the connecting channels 224 is shown. Reactant gas is supplied to the annular channel 220, which supplies reactant gas to the connecting channels 224. A plurality of through holes 232 fluidly connects the connecting channels 224 to the lower chamber. In some examples, the plurality of through holes 232 have a diameter in a range from 0.1 mm to 1 mm, although other diameters may be used. The plurality of through holes 232 can be located along the connecting channels 224 with uniform or non-uniform spacing.

In FIG. 8, a second cross-sectional view taken through the area 228 is shown. The plurality of through holes 230 pass through the bottom surface 208 from the upper chamber to the lower chamber. As can be seen, the flow paths of the excited gas species and the reactant gas species are separate until they reach the lower chamber.

Figure 9:
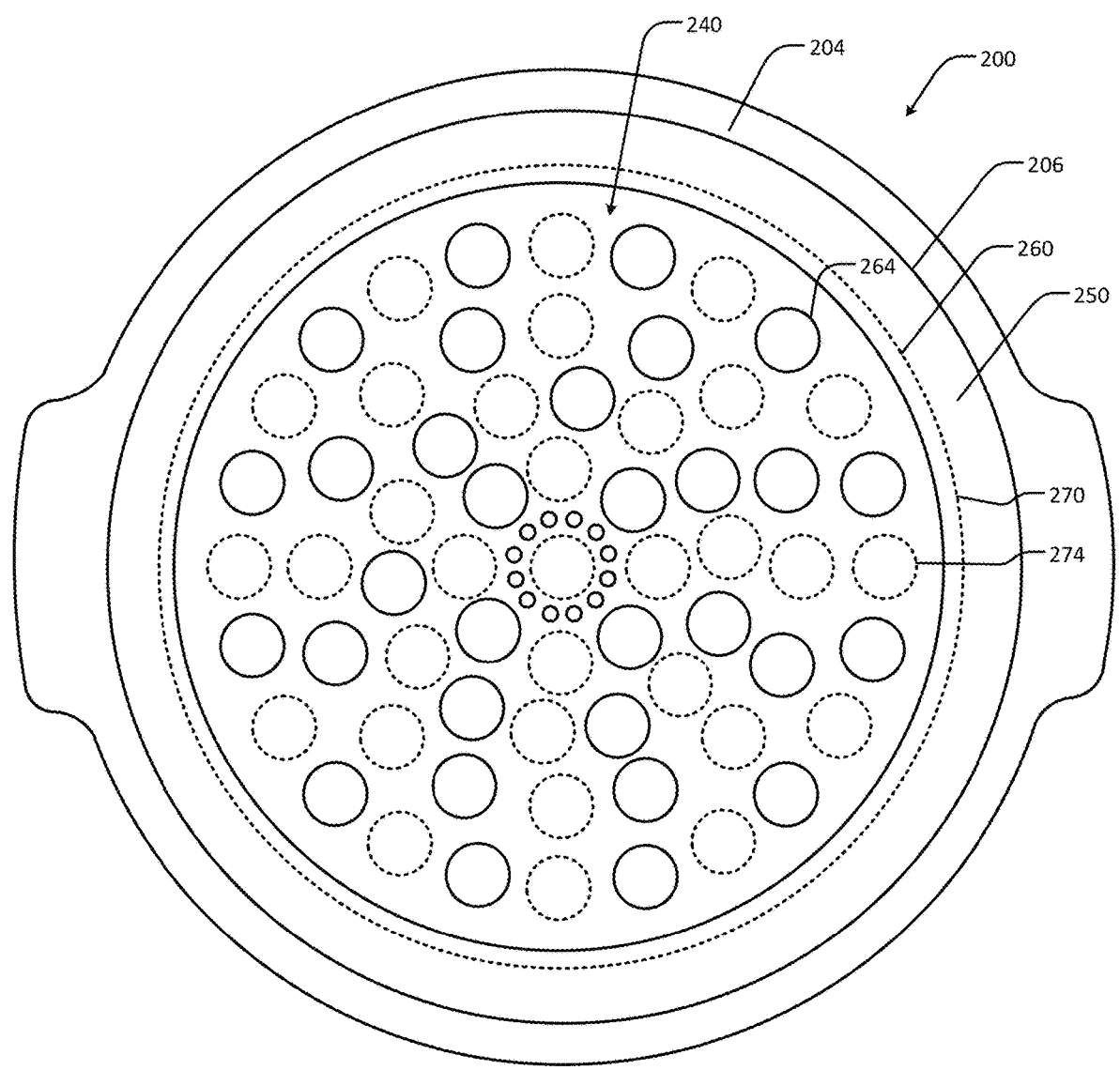
FIG. 9 is a plan view illustrating an example of a light blocking structure for the gas distribution device according to the present disclosure.
Figure 10:
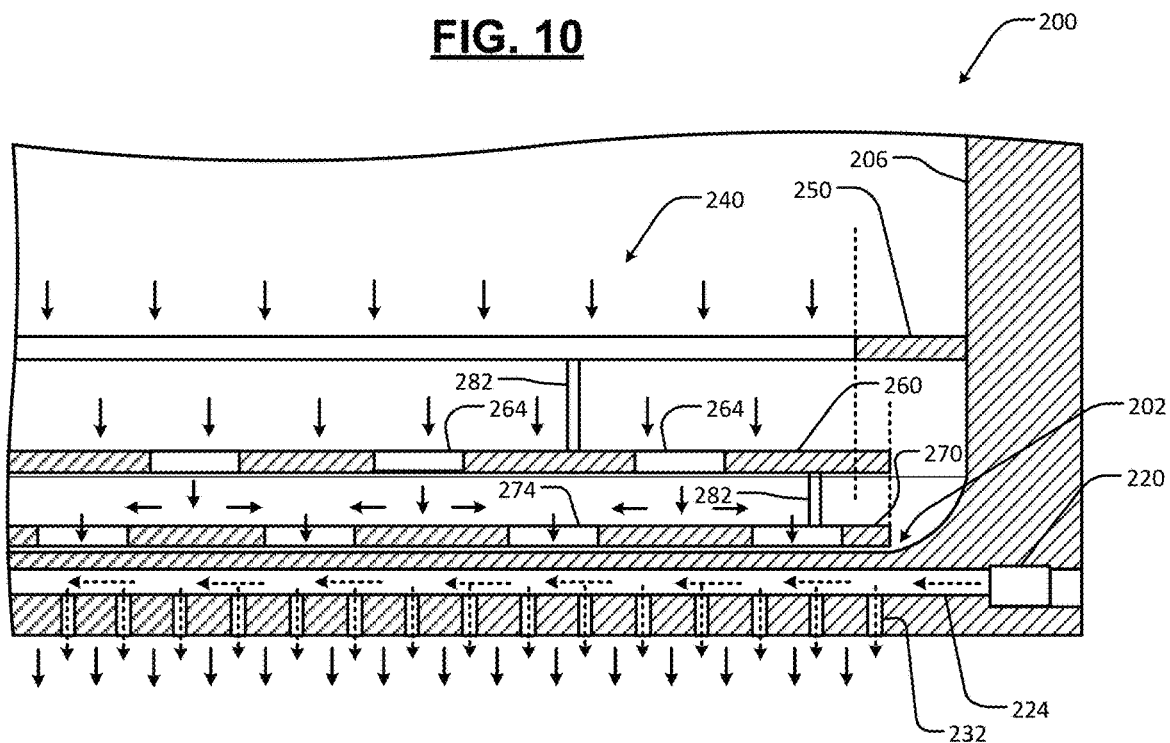
FIG. 10 is a side cross-sectional view of an example of a light blocking structure and the dual gas plenum according to the present disclosure.

Referring now to FIG. 9, a light blocking structure 240 may be arranged between the plasma and the dual gas plenum 202. The light blocking structure 240 may be used to block vacuum ultraviolet (VUV) light generated by the plasma. In other words, the light blocking structure 240 prevents a line of sight path between the plasma in the upper chamber and the substrate in the lower chamber.

In some examples, the light blocking structure 240 includes (from top to bottom) an annular plate 250 including a radially outer surface adjacent to and/or abutting the sidewall 206, a first blocking plate 260 including through holes 264 (shown in solid lines) and a second blocking plate 270 including through holes 274 (shown in dotted lines). In some examples, the plurality of through holes 264 are located in an offset location relative to the plurality of through holes 274. In some examples, the plurality of through holes 264 and 274 have a circular cross-section, although other cross-sections can be used. While the plurality of through holes 264 and 274 are shown as having roughly the same diameter, different size through holes can be used (for example as shown at a center region of the first blocking plate 260). In some examples, hole diameter is in a range from 0.1" to 2", the number of holes is in a range from 10 to 3000 holes, a thickness of the plate is in a range from 0.1" to 0.5"

The light blocking structure 240 may include various arrangements of the blocking plates (with or without through holes) and/or annular plates arranged above the dual gas plenum 202. For example in FIG. 10, the annular plate 250 is arranged above the first blocking plate 260, which is arranged above the second blocking plate 270. In some examples, the annular plate 250 is attached adjacent to or abuts the sidewall 206. The annular plate 250 can be attached to a rest on the sidewall 206 using fasteners, notches (in the sidewall or the annular plate) and projections (in the annular plate or the sidewall), or other fastening devices (not shown).

In some examples, a radially inner edge of the annular plate 250 is radially spaced in a range from 0.5" to 3" from the radially outer edge of the annular plate 250. In other examples, the light blocking structure 240 rests on the bottom surface 208 and is not directly attached to the sidewalls 206. In some examples, the first blocking plate 260 is attached to a lower surface of the annular plate 250 by two or more spacers 282. In some examples, the spacers 282 may be attached to the annular plate 250 and the first blocking plate 260 by fasteners (not shown) such as screws, threads, rivets, adhesive, welding, etc.

In use, excited gas species generated by the plasma in the upper chamber flow through the light blocking structure 240 such that no direct line of sight exists between the plasma and the substrate. The excited gas species flow through the light blocking structure 240 and the plurality of through holes 230 into the lower chamber as shown in FIG. 8 while the reactant gas species flows through the annular channel 220, the connecting channels 224, and the plurality of through holes 232 before flowing into the lower chamber as shown in FIG. 7. In some examples, a radially inner edge of the annular plate 250 is arranged inwardly of a radially outer edge of one or more of the first and second blocking plates 260, 270, respectively.

Figure 11:
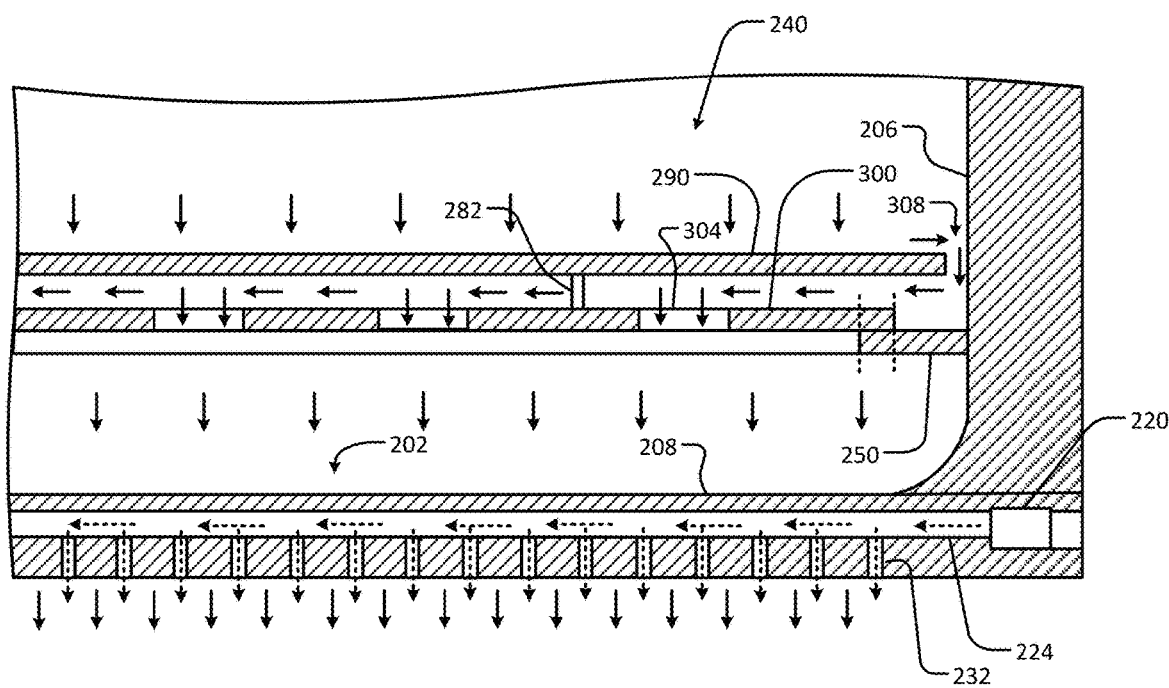

Referring now to FIG. 11-13, other variations of the light blocking structure 240 are shown. In FIG. 11, the light blocking structure 240 includes (from top to bottom) a first blocking plate 290 without through holes, a second blocking plate 300 including a plurality of though holes 304, and the annular plate 250. The first blocking plate 290 may have a diameter that is slightly less than a diameter defined by the sidewalls 206. A gap 308 is created between a radially outer edge of the first blocking plate 290 and the sidewalls 206. In some examples, the gap is less than or equal to 0.5". In some examples, the gap is less than or equal to 0.1". Spacers 282 may be used to provide a gap between the second blocking plate 300 and the first blocking plate 290.

Excited gas species flow through the gap 308 and are directed by the annular plate 250 and the second blocking plate 300 to the plurality of through holes 304. The excited gas species flow through the plurality of through holes 230 of the gas distribution device 200 and into the lower chamber as shown in FIG. 8. Likewise, the reactant gas species flow through the annular channel 220, the connecting channels 224 and the plurality of through holes 232 into the lower chamber as shown in FIG. 7.

In FIG. 12, the light blocking structure 240 includes (from top to bottom) a first blocking plate 310 including through holes 314, a second blocking plate 320 including through holes 324, and the annular plate 250. The first blocking plate 310 may also define the gap 308. The second blocking plate 320 includes a radially outer portion that rests on a radially inner portion of the annular plate 250. Spacers 282 may be used between the second blocking plate 320 and the first blocking plate 310.

The first blocking plate 310 may have a diameter that is slightly less than a diameter defined by the sidewalls 206. Excited gas species flow through the plurality of through holes 314 and 324 via an indirect path. The excited gas species flow through the plurality of through holes 230 of the gas distribution device 200 and into the lower chamber as shown in FIG. 8. Likewise, reactant gas species flow through the annular channel 220, the connecting channels 224 and the plurality of through holes 232 into the lower chamber as shown in FIG. 7.

Referring now to FIG. 13, the light blocking structure 240 includes (from top to bottom) a first blocking plate 360 without holes and the annular plate 250. One or more spacers 280 may be used to define an axial gap between the first blocking plate 360 and the annular plate 250. A radially outer surface of the annular plate 250 is adjacent to or abuts the sidewall 206. Excited gas species flow around a radially outer edge of the first blocking plate 360 through the gap 308 and are directed by the annular plate 250 inwardly. The excited gas species flow through the plurality of through holes 230 of the gas distribution device 200 and into the lower chamber as shown in FIG. 8. Likewise, reactant gas species flow through the annular channel 220, the connecting channels 224 and the plurality of through holes 232 into the lower chamber as shown in FIG. 7.

In some examples, the axial spacing is in range from 0.5" to 2". In some examples, the diameter of the top plate is in a range from 4" to 11.5". in some examples, the ring 208 adjusts with a plate diameter of the first blocking plate 360 to maintain no line of sight for the light from plasma above the first blocking plate 360.

Referring now to FIG. 14, another example of a gas distribution device 200 includes a first showerhead 400 that includes a plurality of through holes 410 and is arranged on the annular plate 250 above the dual gas plenum 202. In some examples, the hole size of the first showerhead 400 is in a range from 0.1" to 0.5", spacing is in a range from 0.07"-2", and a number of holes in the first showerhead 400 is in a range from 200 to 400 holes.

A radially outer surface of the annular plate 250 is adjacent to or abuts the sidewall 206. Excited gas species flow through the first showerhead 400. The excited gas species then flow through the plurality of through holes 230 of the gas distribution device 200 and into the lower chamber as shown in FIG. 8. Likewise, reactant gas species flow through the annular channel 220, the connecting channels 224 and the plurality of through holes 232 into the lower chamber as shown in FIG. 7. Since the plurality of through holes 410 of the first showerhead 400 are generally not aligned with the plurality of through holes 230 in the bottom surface 208, most of the VUV light generated by the plasma is blocked.

Referring now to FIGS. 15A and 15B, another gas distribution device 200 is shown. Instead of using the plurality of through holes 230 having a straight path as shown in FIG. 8, a plurality of through holes 420 are provided that define an indirect path through the bottom surface 208 of the gas distribution device 200. For example, the plurality of through holes 420 may have a first portion extending in first or axial direction, a second portion connected to the first portion and extending in a second direction (for example parallel to the substrate), and a third portion connected to the second portion and extending in the first or axial direction. The plurality of through holes 420 may have other paths such as a diagonal path or a combination of diagonal, axial and/or radial. In some examples, the bottom surface 208 is made of multiple plates that are welded, bonded, fastened or otherwise attached together. For example in FIG. 15A, the bottom surface 208 includes first, second and third plates 430, 432 and 434. The first plate 430 defines the first portions, the second plate 432 defines the second portions and the third plate 434 defines the third portions. In FIG. 15B, the reactant gas flows in a manner that is similar to that shown in FIG. 7.

Figure 16:
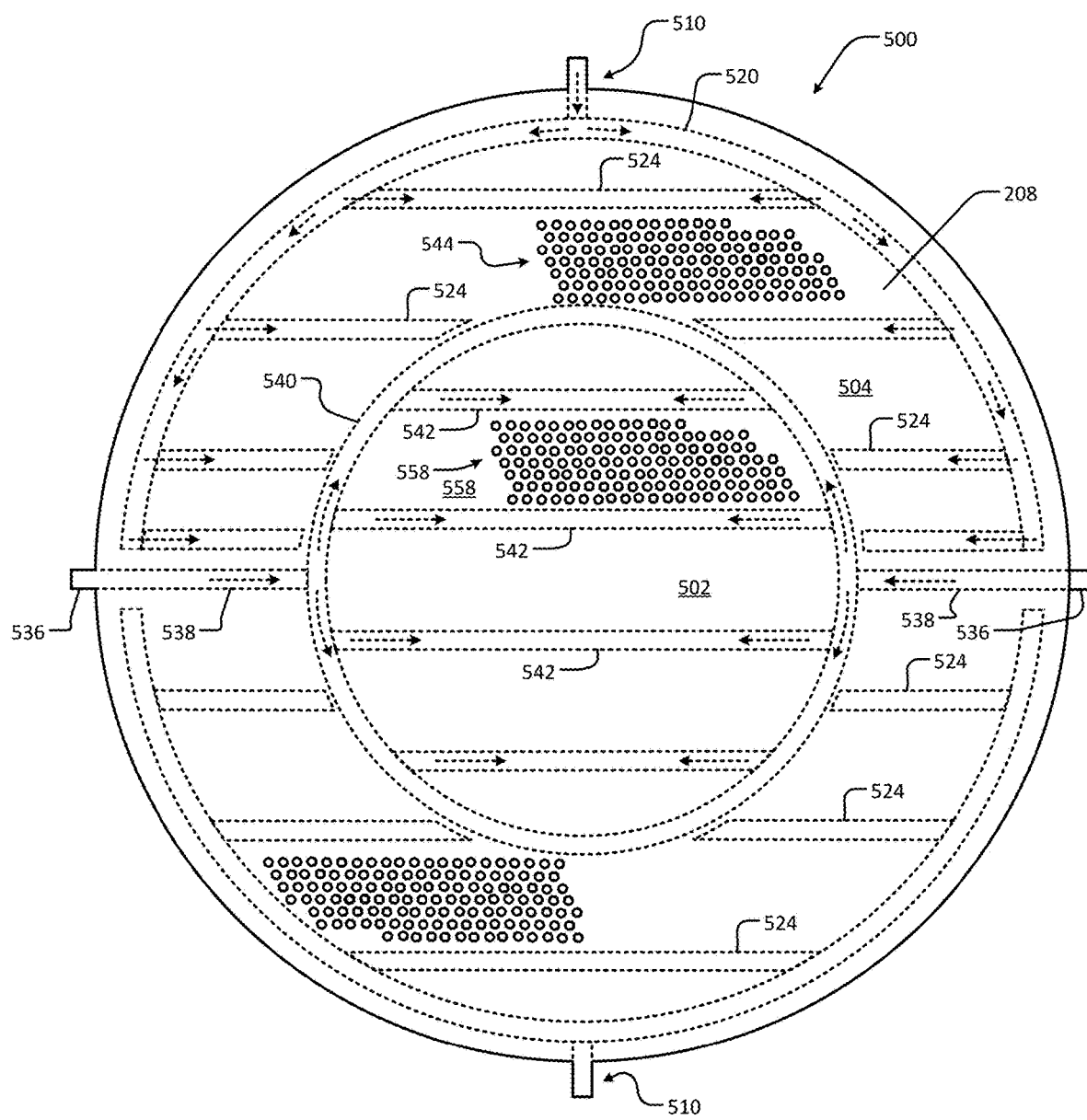
FIG. 16 is a plan view of another example of a zoned dual gas plenum according to the present disclosure.

Referring now to FIG. 16, a gas distribution device 500 is shown. The gas distribution device 500 delivers one or more reactant gas mixtures using a center zone 502 and an edge zone 504. The center zone 502 is located at a radially inner portion of the bottom surface 208 and the edge zone 504 is located around the center zone 502. The edge zone 504 includes one or more inlets 510 that supply a first reactant gas mixture to an annular channel 520 located around a radially outer edge of the bottom surface 208 and connecting channels 524. The connecting channels 524 extend inwardly from the annular channel 520. Through holes (as shown above) extend downwardly from the annular channel 520 and/or the connecting channels 524 into the lower chamber.

The central zone 502 includes one or more gas inlets 536 that supply a second reactant gas mixture. The central zone 502 includes radial channels 538 connected to an annular channel 540. The annular channel 540 is connected to connecting channels 542. Through holes (as shown above) extend downwardly from the annular channel 540 and/or the connecting channels 542. A plurality of through holes 558 are arranged in areas 550 located between the channels. The first and second gas mixtures may include the same or different gas species or ratios of gases.

Figure 17:
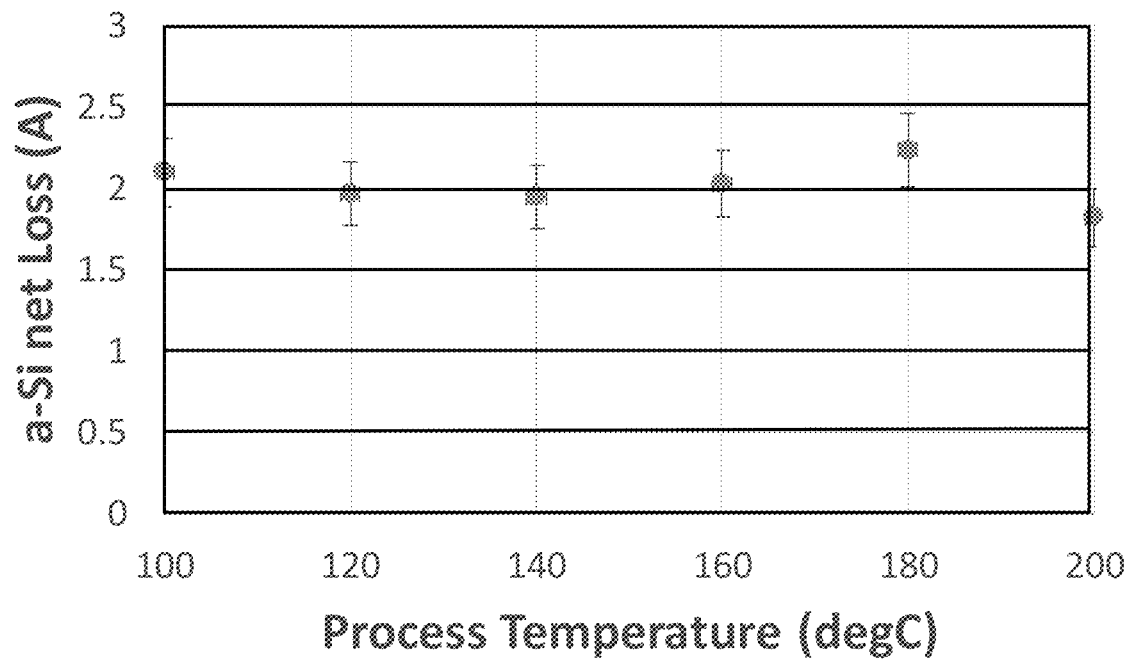
FIGS. 17 and 18 are graphs illustrating examples of net loss of amorphous silicon (a-Si) for different process temperatures and periods according to the present disclosure.
Figure 18:
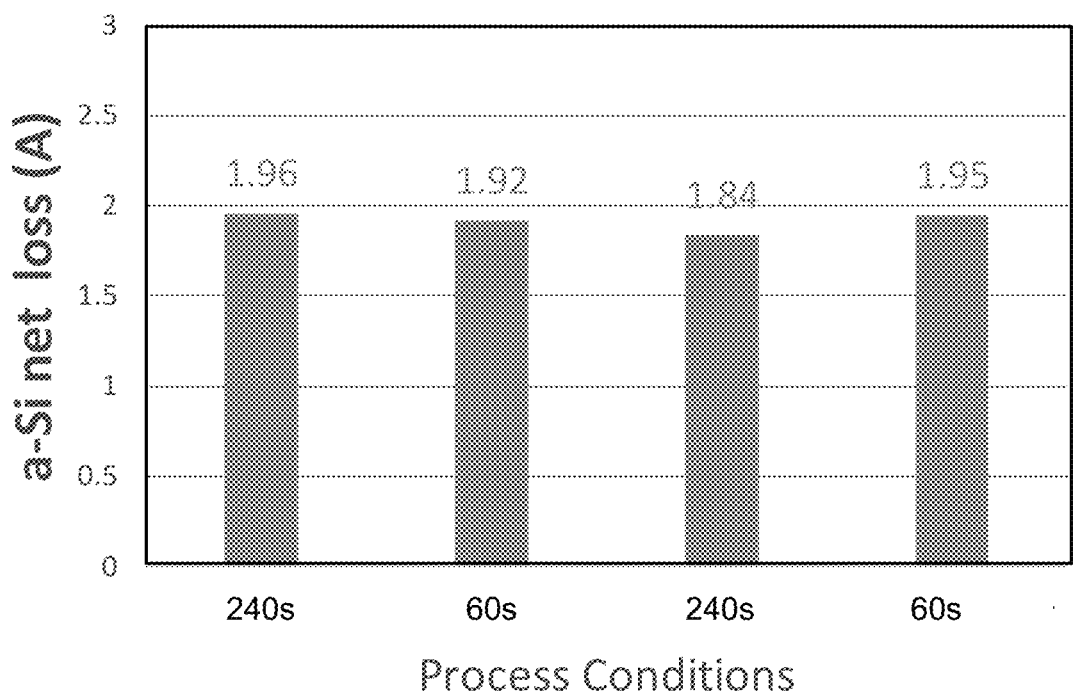

Referring now to FIGS. 17 and 18, graphs illustrating net loss of amorphous silicon (a-Si) for different process temperatures and periods is shown. As can be appreciated, the a-Si experiences less than 2 Angstroms of loss during processing, which is a reduction of 50% as compared to prior processes.

Figure 19:
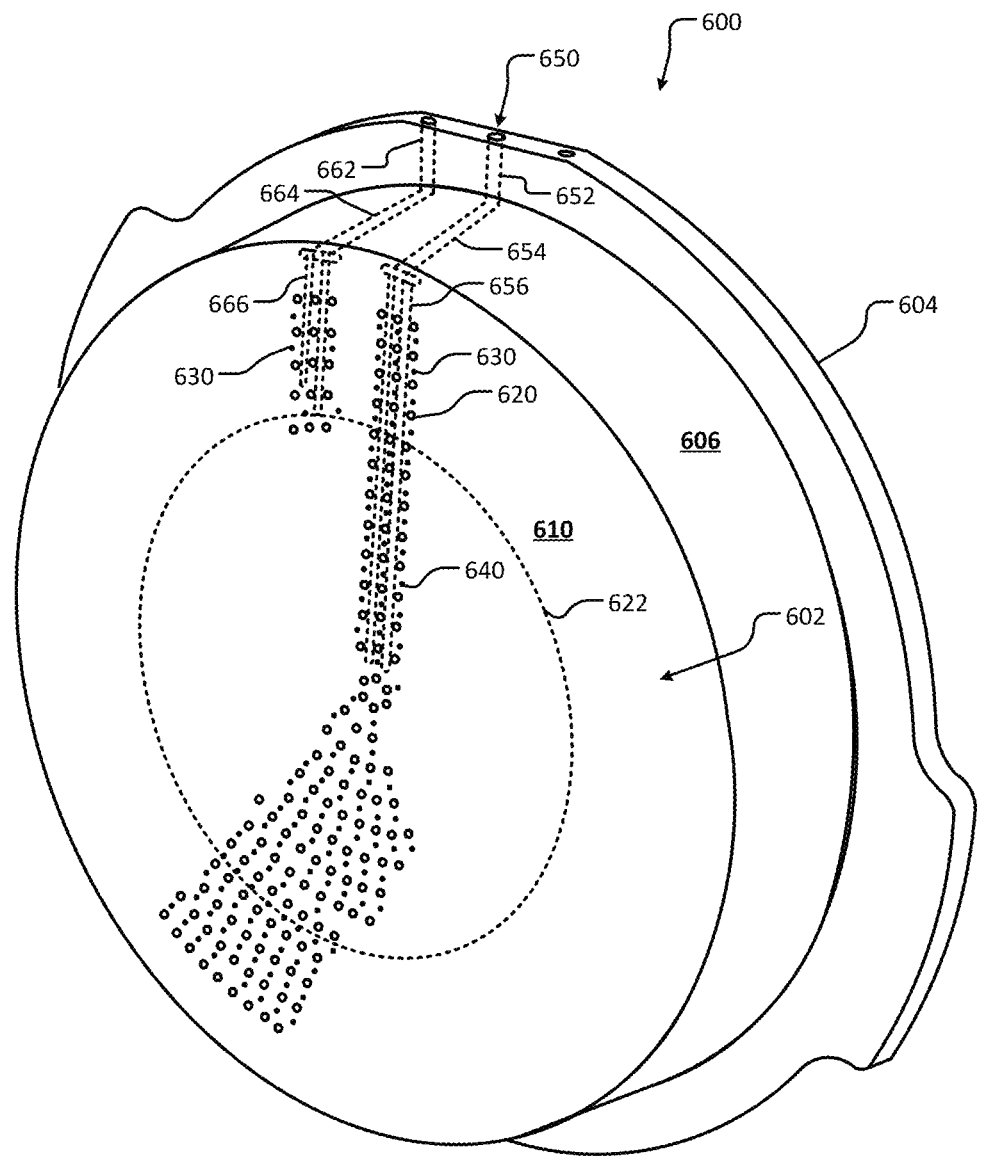
FIG. 19 is a perspective view of a gas distribution device including a zoned dual gas plenum according to the present disclosure.

Referring now to FIG. 19, another example of a gas distribution device 600 including a zoned dual gas plenum 602 is shown. The gas distribution device 600 includes a flange 604 that extends radially outwardly from side wall 606 and a bottom surface 610 partially defining the dual gas plenum 602. The bottom surface 610 includes a first plurality of through holes 620 (partially shown for clarity) extending from the upper chamber through the bottom surface 610 to the lower chamber. During use, excited gas species generated by the plasma in the upper chamber flows through the first plurality of through holes 620 into the lower chamber. In some examples, the first plurality of through holes 620 is arranged in a plurality of concentric circular rings (having different diameters) each including a single row of uniformly spaced through holes.

The bottom surface 610 further includes a second plurality of through holes 630 (partially shown for clarity) that are associated with a first zone that is located radially outside of a circle 622. The bottom surface 610 further includes a third plurality of through holes 640 (partially shown for clarity) that are associated with a second zone located radially inside of the circle 622. In some examples, the second and third plurality of through holes 630, 640 are arranged in a plurality of concentric circular rings (having different diameters) each including a single row of uniformly spaced through holes. In some examples, the concentric circular rings of the second and third plurality of through holes 630 and 640 are located between the concentric circular rings of the first plurality of through holes 620 as shown.

One or more gas inlets 650-1, 650-2, etc. (collectively gas inlets 650) may be arranged along a radially outer surface of the flange 604. One or more channels 652 in the flange 604, one or more channels 654 in the side wall 606, and one or more channels 656 in the bottom surface 610 provide a fluid connection from the gas inlet 650-1 to the third plurality of through holes 640. In some examples, the one or more channels 656 are arranged in a radial direction in the bottom surface 610, although non-radial channels can be used. One or more channels 662 in the flange 604, one or more channels 664 in the side wall 606, and one or more channels 666 in the bottom surface provide a fluid connection from another gas inlet 650-2 to the second plurality of through holes 630.

Figure 20:
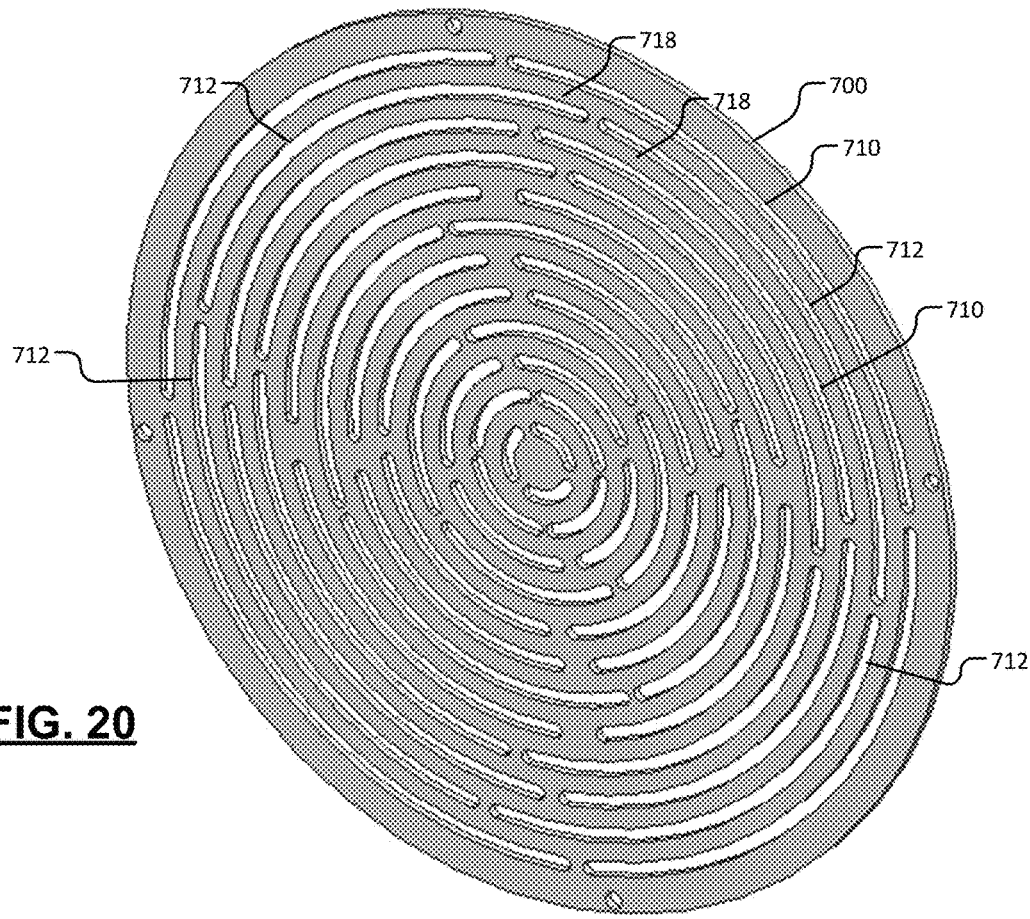
FIG. 20 is a perspective view of a blocking plate of FIG. 19.

Referring now to FIG. 20, a blocking plate 700 may be arranged in the upper chamber above the bottom surface 610 to block direct line of sight from the plasma to the substrate. The blocking plate 700 includes a plurality of concentric rings 710. Each of the concentric rings 710 includes one or more arcuate slots 712. For example, each of the concentric rings 710 includes arcuate slots 712 that are angularly offset from one another. In the example in FIG. 20, each of the concentric rings 710 includes three or four arcuate slots 712 that are spaced from one another, although additional or fewer arcuate slots 712 can be used. In some examples, the arcuate slots 712 are not aligned with the through holes 620 when the blocking plate 700 is arranged relative to the bottom surface 610. Adjacent plate portions 718 located between the arcuate slots 712 are aligned with the through holes 620 to block the line of sight from the plasma to the substrate.

Figure 21:
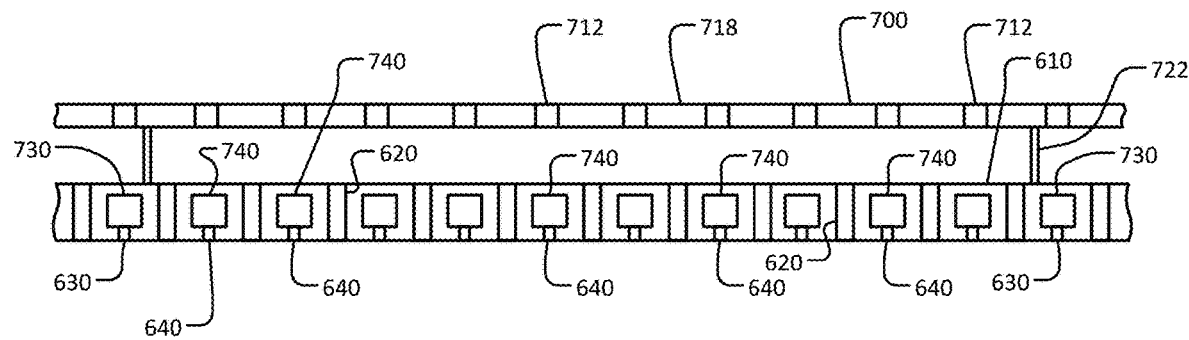
FIG. 21 is a partial cross-sectional view of a bottom surface of the dual gas plenum of FIG. 19.

Referring now to FIG. 21, a partial cross-section of the bottom surface 610 of the dual gas plenum 602 is shown. The blocking plate 700 is located on the bottom surface 610 or is spaced therefrom by one or more spacers 722 as described above. The bottom surface 610 includes annular channels 730, 740 that are in fluid communication with the channel 656 or 666 depending upon the radial position of the annular channel 730, 740. In some examples, the annular channels 730, 740 are concentric and are located between the concentric rings of defined by the first plurality of through holes 620. The annular channels 730 are in fluid communication with the second plurality of through holes 630. The annular channels 740 are in fluid communication with the third plurality of through holes 640.

In use, excited gas species are supplied by the plasma in the upper chamber through the first plurality of through holes 620 to the lower chamber. The blocking plate 700 blocks a line of sight from the plasma to the substrate. A first reactant gas mixture is supplied to the gas inlet 650-1. The first reactant gas mixture flows through the channels 652, 654 and 656 into the annular channel 730 and through the second plurality of through holes 630 into a radially outer portion of the lower chamber. A second reactant gas mixture is supplied to the gas inlet 650-2. The second reactant gas mixture flows through the channels 662, 664 and 666 into the annular channel 740 and through the third plurality of through holes 640 into a radially inner portion of the lower chamber. In some examples, the first and second reactant gas mixtures are the same reactant gas mixture, although different reactant gas mixtures can be used. In some examples, the first and second reactant gas mixtures are delivered at different flow rates, although the same flow rate can be used.

In some examples, the inner zone (inside of the circle 622) is defined by a center of the bottom surface to a radial distance equal to 40% to 70% of the maximum radial distance. The outer zone (outside of the circle 622) is defined radially outside of the inner zone. In some examples, the inner zone (inside of the circle 622) is defined by a center of the bottom surface and a radial distance in a range from 70 to 120 mm. The outer zone (outside of the circle 622) is defined an outer edge of the inner zone to 150 mm. In some examples, the first plurality of through holes 620 includes 200 to 4000 holes. In some examples, the blocking plate 700 is spaced in a range from 0.07" to 3" from the bottom surface 610.

Referring now to FIG. 22, a substrate processing system 750 that performs plasma pulsing to enhance an ash rate during photoresist stripping and/or a removal rate during film removal is shown. In some examples, optical feedback is used to identify predetermined RF pulsing parameters and/or to control the plasma pulsing. For example, an optical emission spectroscopy (OES) sensor 760 generates optical feedback by detecting spectra of the plasma. In some examples, the OES sensor 760 is arranged in a viewport (not shown) arranged in a sidewall of the processing chamber 60. Intensities of one or more specific emission lines corresponding to the selected metastable species are monitored. In some examples, a collimating tube (not shown) is used between the viewport and the OES sensor 760. An output of the OES sensor 760 is fed back to the system controller 140.

An RF generating system 770 further includes a pulse modulator 772 that receives an output of the RF generator 88 and performs plasma pulsing by modulating the power output of the RF generator 88 using a modulating waveform such as a square, rectangular, triangular, saw tooth, sinusoidal or other type of modulating waveform. RF pulsing parameters such as the frequency and/or duty cycle of the modulating waveform can also be varied. The system controller 140 adjusts one or more of the RF pulsing parameters based on the feedback. In some examples, the RF pulsing parameters are varied to identify a set of RF pulsing parameters where the intensity of the metastable species during a first state (such as an ON state) is less than the intensity of the metastable species during a second state (such as an OFF state).

Figure 23A:
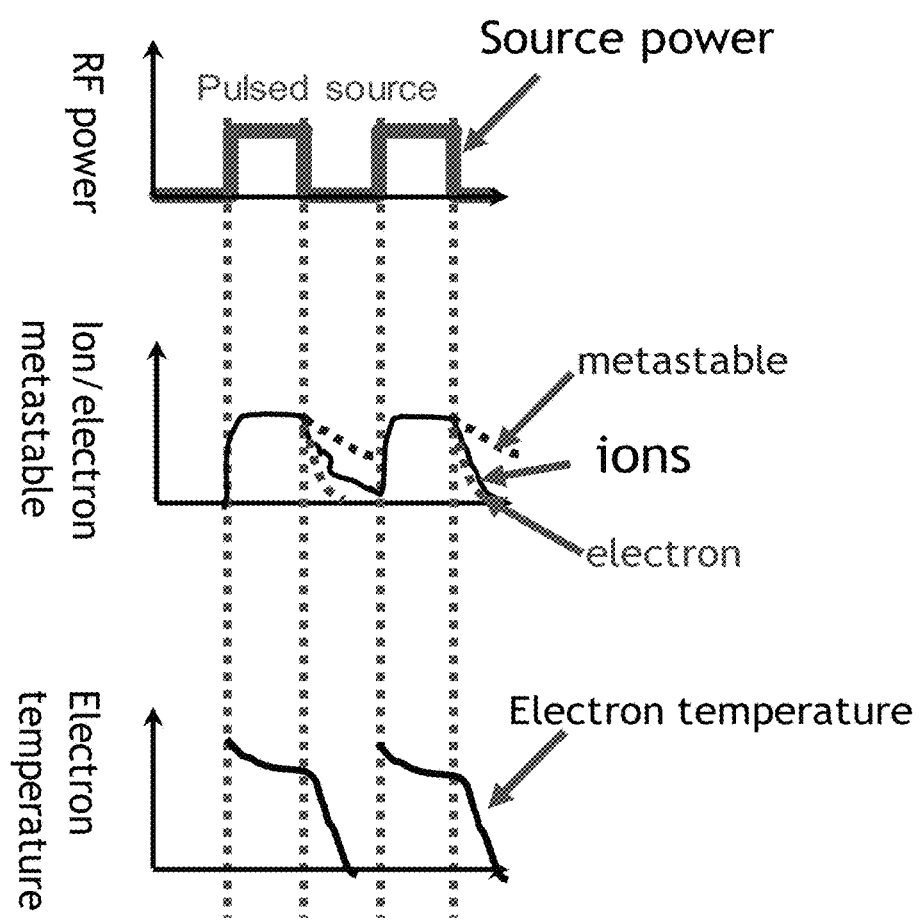
FIG. 23A is a graph illustrating enhanced long lifetime species created by pulsing the plasma according to the present disclosure.

Referring now to FIGS. 23A and 23B, metastable species are enhanced when the RF plasma is pulsed as compared to non-pulsed plasma for at least two reasons. In FIG. 23A, enhanced long lifetime species are created when the plasma is pulsed. In this example, the plasma is pulsed using a square wave signal.

The metastable species have a longer lifetime than ions and electrons. For example, He metastable species are at least 3 orders of magnitude higher than He+ and excited states. As can be appreciated, high energy Ar species can also be generated by pulsed plasma. Use of pulsed Ar plasma will generally cost less than use of He plasma. When pulsed plasma is used, more metastable species will diffuse into the substrate and the ash rate is enhanced. In some examples, a 25% improvement in ash rate can be achieved as compared to non-pulsed plasma.

Fast electrons during the second state (such as the plasma source off state) increase specific line optical emission (for example, 420 nm and 549.6 nm emission lines for Ar plasma). Systems and methods described herein monitor intensity levels at specific line optical emission wavelengths of the metastable species and control the RF pulsing parameters based thereon to ensure that the intensity of metastable species during the first state is less than the intensity of the metastable species during the second state.

In FIG. 23B, a fast electron effect is also created by pulsing the plasma. As can be seen, emission intensity of the metastable species increases when the RF plasma is off after a period when the RF plasma is on. When the modulating waveform is on, production of metastable species occurs due to electron collision. When the modulating waveform is off, reproduction occurs by recombination. Fast electrons are created when the modulating waveform is off by chemionization of slow electrons and metastable species, which further increases metastable species density.

While a fixed duty cycle can be used, the duty cycle can also be varied based on feedback from the OES sensor. In other words, the intensity at one or more wavelengths is monitored. When the intensity during an OFF period falls below the intensity during a prior ON period of the modulating waveform, the modulating waveform can be turned back ON for a predetermined period and then the modulating waveform is turned back OFF to create enhanced metastable species intensity.

Figure 24A:
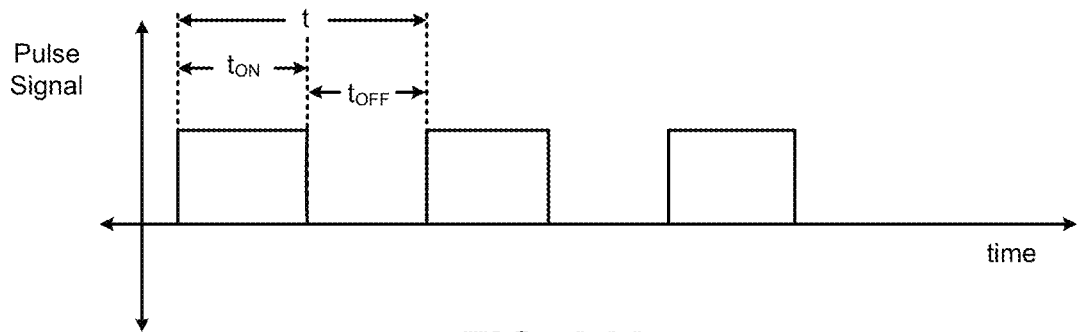
FIG. 24A is a graph illustrating an example of a pulsed signal to modulate RF plasma signal according to the present disclosure.
Figure 24B:
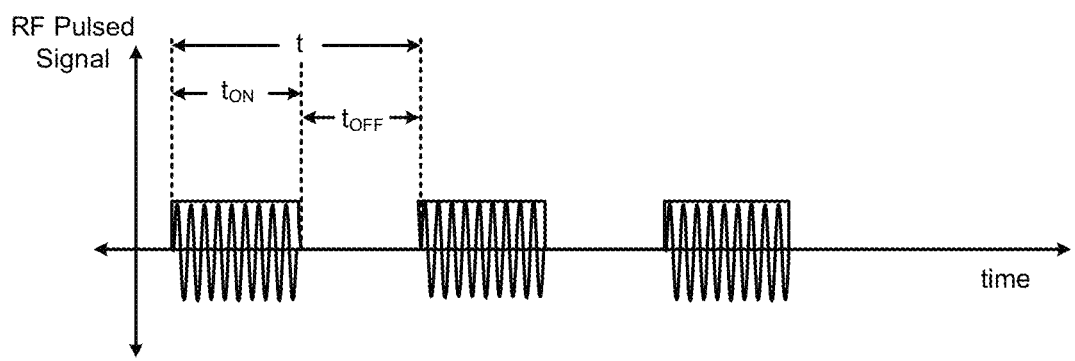
FIG. 24B is a graph illustrating an example of the pulsed signal modulating the RF plasma signal according to the present disclosure.
Figure 24C:
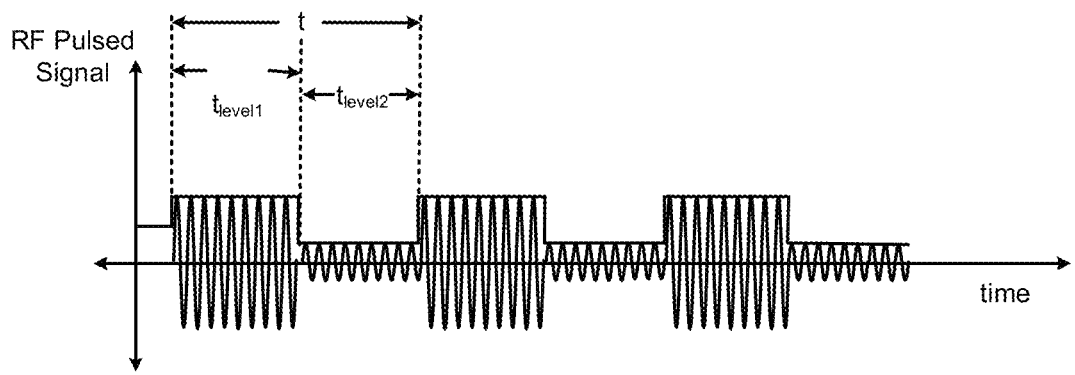
FIG. 24C is a graph illustrating an example of a pulsed level-to-level signal modulating the RF plasma signal according to the present disclosure.

Referring now to FIGS. 24A to 24C, examples of pulsed signals that are used to modulate the RF plasma signal are shown. In FIG. 24A, a modulating waveform includes a pulsed square wave that has a period of t, an on time of $t_{ON}$ and an off time of $t_{OFF}$. The duty cycle is defined as $t_{ON}/t$. The amplitude, frequency, and/or duty cycle is varied and optical feedback is used to identify pairs of RF pulsing parameters where the intensity of metastable species during the first state is less than the intensity of metastable species during the second state. In FIG. 24B, both the modulating waveform and the RF plasma signal are shown. In FIG. 24C, a pulsed dual level1-to-level2 signal modulates the RF plasma signal.

Figure 25A:
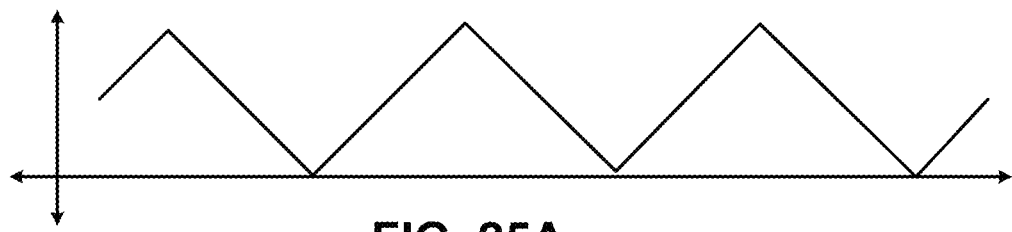
FIGS. 25A to 25D illustrate other examples of pulsed signals for modulating the RF plasma signal according to the present disclosure.
Figure 25B:
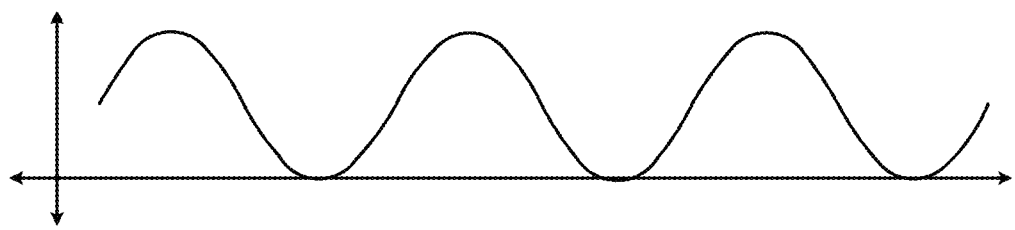
Figure 25C:
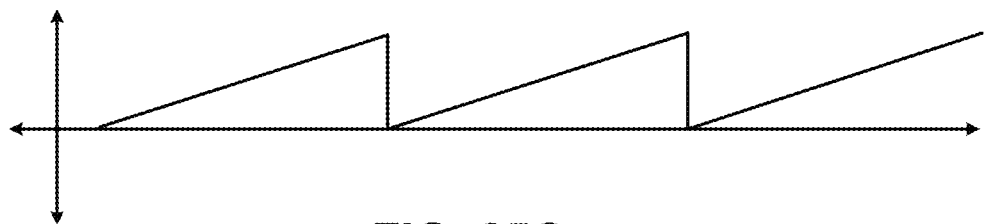
Figure 25D:
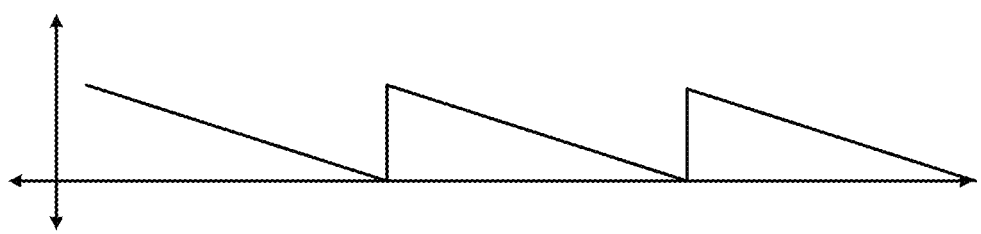

Referring now to FIGS. 25A to 25D, other examples of pulsed signals for modulating the RF plasma signal in addition to those shown and described above are shown. In FIG. 25A, a triangular-shaped waveform may be used to modulate the RF plasma signal. In FIG. 25B, a sinusoidal-shaped waveform may be used to modulate the RF plasma signal. In FIG. 25C, an increasing saw tooth waveform may be used to modulate the RF plasma signal. In FIG. 25D, a decreasing saw tooth waveform may be used to modulate the RF plasma signal.

Figure 26:
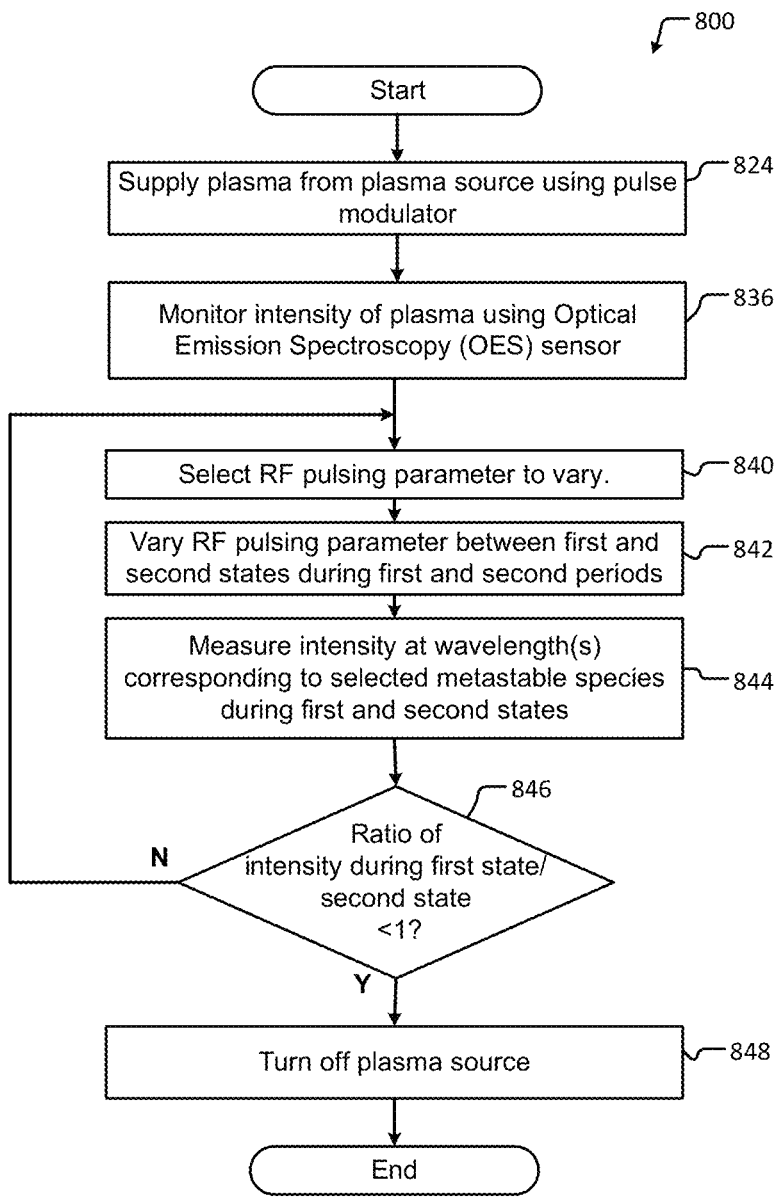
FIG. 26 is a flowchart illustrating a method for identifying pairs of RF pulsing parameters having a desired intensity ratio according to the present disclosure.

Referring now to FIG. 26, a method 800 for identifying pairs of RF parameters of the modulating signal that can be used to provide a desired intensity ratio (the intensity during a first state divided by the intensity during the second state). The method 800 uses optical feedback from an optical emission spectroscopy (OES) sensor to monitor one or more wavelengths corresponding to the selected metastable species. The feedback is further used to identify pairs of RF pulsing parameters of the modulating signal having the desired intensity ratio. In some examples, the desired intensity ratio is less than 1. In other examples, the intensity ratio is minimized.

During each iteration, the method selects an RF pulsing parameter (corresponding to a first state of the modulating signal) and measures the intensity using the OES sensor. The RF pulsing parameter is varied (to a second state of the modulating signal) and then the method measures the intensity using the OES sensor. Examples of RF pulsing parameters of the modulating signal that can be switched include a duty cycle of the modulating signal (e.g. between two values such as 0% and 100%, 10% and 100%, zero and a non-zero percentage value, or two non-zero percentage values), a pulsing frequency of the modulating signal (such as two different frequencies), magnitude(s) of the modulating signal, a shape of the modulating signal, and/or combinations thereof.

Identification of potential RF pulsing parameters can be performed with or without a substrate located in the processing chamber. At 824, plasma is supplied from a plasma source via a pulse modulator. In some examples, the pulse modulator begins operation in a first pulsing state. The pulse modulator can be used to vary the RF pulsing parameters between the first and second states.

At 836, the intensity at one or more predetermined wavelengths corresponding to the selected metastable species is monitored using the OES sensor. At 840, the RF pulsing parameter that will be varied between states is selected. For example, duty cycle may be varied from 0% or 20% to 100% to identify duty cycles having an intensity ratio that is less than 1. At 842, the RF pulsing parameters are varied between the first and second states during first and second consecutive periods that may be repeated one or more times. At 844, the intensity is measured at one or more wavelengths (corresponding to the metastable species) during the first and second states. If the intensity ratio is less than 1 as determined at 846, then the RF pulsing parameters can be used and the plasma source can be extinguished at 848. If 846 is false, the process can be repeated by returning to 840 and selecting other RF pulsing parameters to vary.

Figure 27:
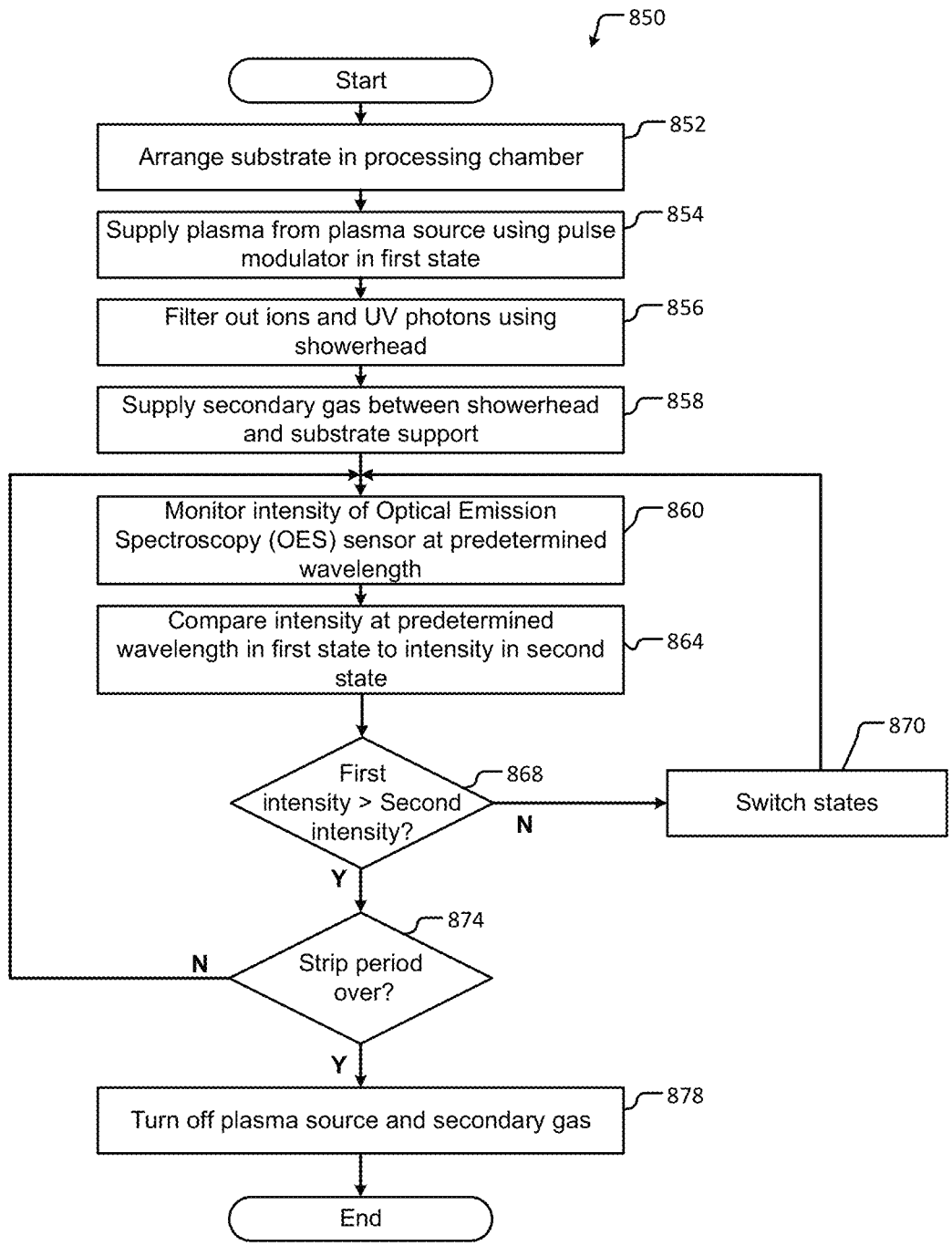
FIG. 27 is a flowchart illustrating a method for using feedback from an optical emission spectroscopy (OES) sensor to switch a pulsed signal between different pulsing states to modulate the RF plasma signal according to the present disclosure.

Referring now to FIG. 27, a method 850 switches the RF parameters between the first and second states during processing of the substrate to enhance the ashing performed by the metastable species. In some examples, the RF pulsing parameters for the first and second states that are identified in the method of FIG. 26 can be used. Timing of the switching between the first and second states can be controlled using feedback from the OES sensor.

At 852, a substrate is arranged in the processing chamber. At 854, plasma is supplied from a plasma source and a pulse modulator operates in a first pulsing state. At 856, ions and UV photons are filtered using a showerhead. At 858, a secondary gas is supplied between the showerhead and a substrate support.

At 860, the intensity of the OES sensor is monitored at predetermined wavelengths corresponding to the metastable species. At 864, the intensity during the first state is compared to the intensity in the second state. The intensity in the second state can correspond to a stored value from a prior period, a predetermined value, or a function of one or more intensity values from a prior period. If the first intensity is less than the second intensity as determined at 868, the method switches states at 870. If the first intensity is greater than the second intensity, the method continues at 874 and determines whether the strip period is over. If 874 is false, then the method continues at 860. If 874 is true, the plasma source and the secondary gas are turned off at 878.

Figure 28:
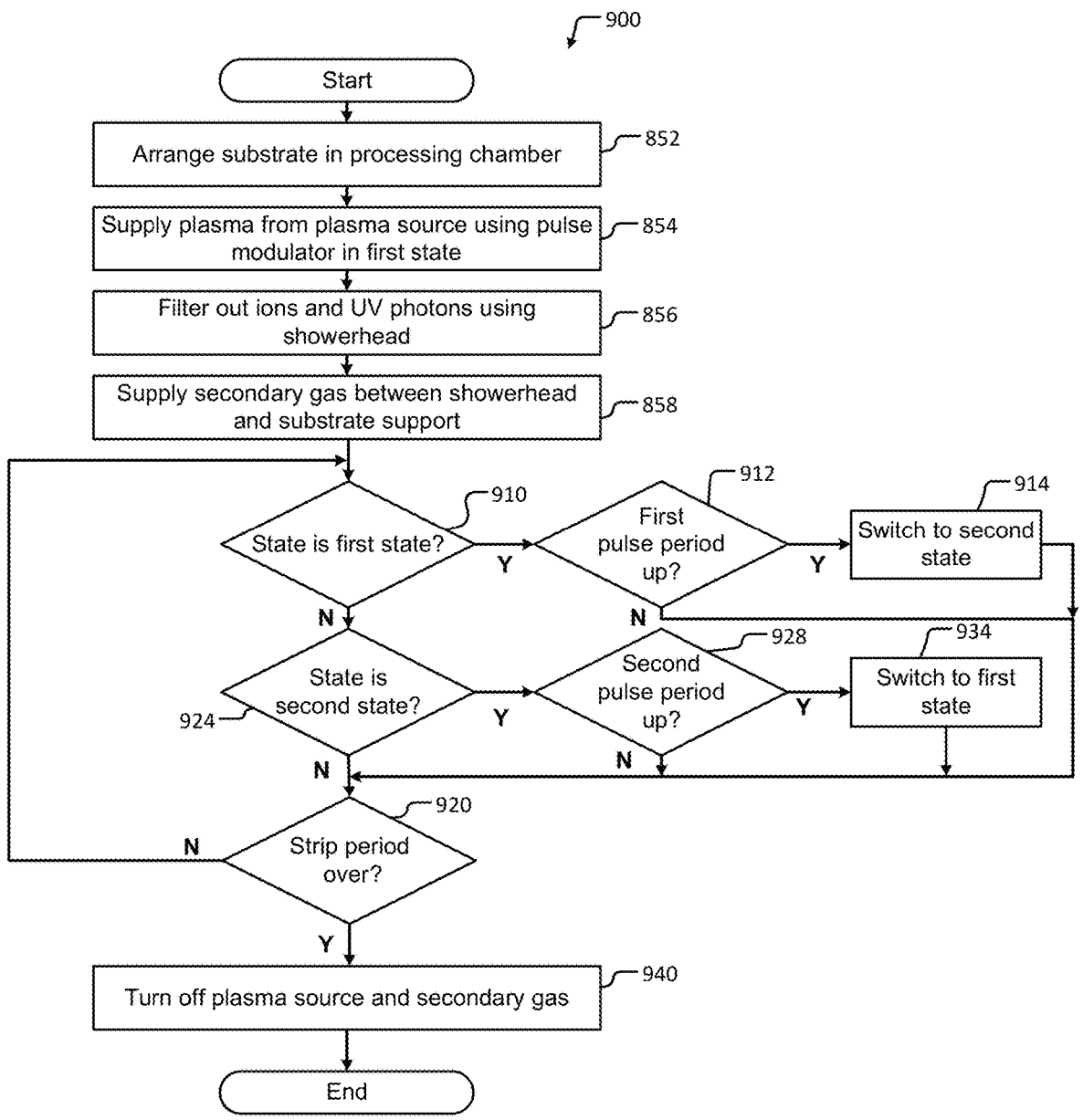
FIG. 28 is a flowchart illustrating a method for pulsing a pulsed signal between different pulsing states at fixed intervals according to the present disclosure.
Figure 29A:
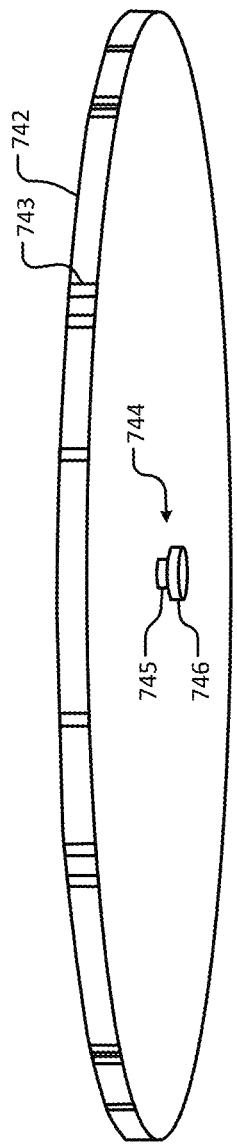
FIG. 29A is a bottom perspective view illustrating a spacer that is located centrally for supporting a blocking plate.
Figure 29B:
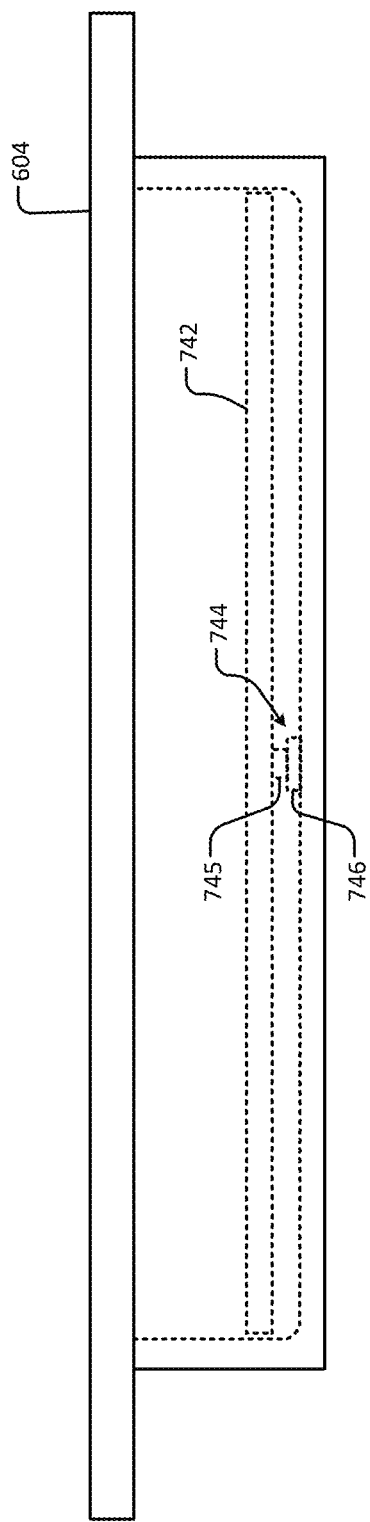
FIG. 29B is a side view illustrating the blocking plate with the spacer that is located centrally in a gas distribution device.

Referring now to FIG. 28, a method 900 switches the RF parameters between the first and second states during processing of the substrate. The RF pulsing parameters for the first and second states that are identified in the method of FIG. 26 can be used. Rather than using feedback, switching between the first and second states is performed at predetermined intervals.

At 910, the method determines whether the pulsing state is equal to the first pulsing state. If 910 is true, the method determines whether the first pulse period corresponding to the first pulsing state is up at 912. If 912 is false, the method continues at 920. If 912 is true, the method continues at 914 and switches to the second pulsing state. The method continues from 914 to 920.

When 910 is false, the method continues at 924 and determines whether the pulsing state is equal to the second pulsing state. When 924 is true, the method continues at 928 and determines whether the second pulse period is up. When 928 is false, the method continues at 920. When 928 is true, the method continues at 934 and switches from the second pulsing state to the first pulsing state. The method continues from 934 to 920.

At 920, the method determines whether the stripping period is over. If 920 is false, the method continues at 910. When 920 is true, the method continues at 940 and turns off the plasma source and secondary gas.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:
1. A substrate processing system, comprising:
a first chamber;
a second chamber including a substrate support to support a substrate;
a dual gas plenum arranged between the first chamber and the second chamber and including a plasma-exposed side directly exposed to plasma and a substrate-facing side, the dual gas plenum comprising a plate comprising:
a first plenum defined by (i) a first gas channel arranged in an annular sidewall of the dual gas plenum (ii) a plurality of connecting gas channels extending along parallel chords through the dual gas plenum between opposite sides of the first gas channel, and (iii) a first plurality of through holes configured to supply reactive gas species and extending from the plurality of connecting gas channels through the substrate-facing side of the dual gas plenum;
a second plenum defined by a second plurality of through holes extending from the plasma-exposed side of the dual gas plenum to the substrate-facing side of the dual gas plenum and configured to supply metastable species, a plurality of rows of the second plurality of through holes arranged between adjacent ones of the plurality of connecting gas channels;
a flange extending radially outwardly from one end of the annular sidewall;
a second gas channel extending horizontally from a radially outer surface of the flange into the flange; and
a third gas channel extending vertically through the annular sidewall and including a first end in fluid communication with a first end of the second gas channel and a second end directly connected to the first gas channel;
a first gas delivery system configured to supply an inert gas species to the first chamber;
a plasma generating system configured to generate plasma including a metastable species in the first chamber during an etching process performed on the substrate; and
a second gas delivery system configured to supply the reactive gas species to the dual gas plenum,
wherein the first plenum is configured to distribute and deliver the reactive gas species into the second chamber without mixing with the metastable species in the dual gas plenum with plasma on during the etching process performed on the substrate,
wherein the inert gas species is selected from a group consisting of helium, argon, neon, krypton, and xenon to the dual gas plenum, and
wherein the reactive gas species is selected from a group consisting of molecular oxygen, molecular nitrogen, molecular hydrogen, nitrogen trifluoride, and carbon tetrafluoride.
2. The substrate processing system of claim 1, further comprising a controller configured to:
control the first gas delivery system, the second gas delivery system, and the plasma generating system;

cause the first gas delivery system to supply the inert gas species to the first chamber;
strike plasma in the first chamber to generate the metastable species; and
cause the second gas delivery system to supply the reactive gas species, wherein the reactive gas species is selected from a group consisting of molecular oxygen, molecular nitrogen, molecular hydrogen, nitrogen trifluoride, and carbon tetrafluoride.

3. The substrate processing system of claim 1, wherein an upper side of the plurality of connecting gas channels is arranged adjacent to the plasma-exposed side of the dual gas plenum and a lower side of the plurality of connecting gas channels is arranged adjacent to the substrate-facing side of the dual gas plenum.

4. The substrate processing system of claim 1, wherein the dual gas plenum is arranged in a plane parallel to and spaced vertically from a plane including the flange.

5. The substrate processing system of claim 1, wherein:
the plurality of rows comprise at least one row arranged between two other rows without an intervening one of the plurality of connecting gas channels.

6. The substrate processing system of claim 5, wherein the plurality of rows are offset from one another in a direction parallel to a lengthwise direction of the plurality of gas connecting channels.

7. The substrate processing system of claim 5, wherein the plurality of rows extending between adjacent ones of the plurality of connecting gas channels comprise seven rows.

8. The substrate processing system of claim 1, wherein:
the plurality of rows comprise at least one row arranged between two other rows without an intervening one of the first plurality of through holes.

9. The substrate processing system of claim 1, wherein the second gas channel in the flange extends in a direction perpendicular to a lengthwise direction of the plurality of connecting gas channels.

10. The substrate processing system of claim 1, wherein:
the first plurality of through holes has a first diameter in a range from 0.1 mm to 1 mm, and
the second plurality of through holes has a second diameter in a range from 3 mm to 10 mm.

11. The substrate processing system of claim 10, wherein:
all of the first plurality of through holes have the same diameter, and
all of the second plurality of through holes have the same diameter.

12. The substrate processing system of claim 1, wherein the first gas channel includes an annular channel having a fixed radial width.

13. The substrate processing system of claim 1, wherein:
an upper side of the plurality of connecting gas channels is arranged adjacent to the plasma-exposed side of the dual gas plenum, and
areas of the dual gas plenum between the plurality of connecting gas channels and the second plurality of through holes are solid.

14. The substrate processing system of claim 1, wherein:
the first gas channel includes an annular channel having a fixed width, and
the plurality of connecting gas channels are linear and have a fixed width.

15. The substrate processing system of claim 1, wherein the plasma generating system includes an inductive coil arranged around an outer surface of the first chamber and wherein the plasma generating system selectively supplies radio frequency power in a range from 500 W to 5 kW to the inductive coil to generate plasma.

16. The substrate processing system of claim 1, wherein the substrate support controls a temperature of a substrate arranged on the substrate support to a predetermined temperature in a range from 75° C. to 225° C. during etching.

17. The substrate processing system of claim 1, wherein:
the first chamber has a dome shape;
the plasma generating system includes an inductive coil arranged around an outer surface of the first chamber;
the first gas delivery system includes a gas injector arranged in an upper portion of the first chamber; and
the gas injector is configured to inject gas into the first chamber in a center gas injection direction and a side gas injection direction.

18. The substrate processing system of claim 1, wherein:
the plasma generating system includes an inductive coil arranged around an outer surface of the first chamber; and
the plasma generating system includes a pulse modulator configured to vary a pulsing parameter of a radio frequency (RF) signal output to the inductive coil during etching.

19. The substrate processing system of claim 18, wherein the pulsing parameter includes one or more pulsing parameters selected from a group consisting of duty cycle, amplitude, power, and envelope.

* * * * *